(12) United States Patent
    Naito

(10) Patent No.: US 10,985,158 B2
(45) Date of Patent: Apr. 20, 2021

(54) SEMICONDUCTOR DEVICE WITH TRANSISTOR PORTION HAVING LOW INJECTION REGION ON THE BOTTOM OF A SUBSTRATE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 80 days.

(21) Appl. No.: 16/292,259

(22) Filed: Mar. 4, 2019

(65) Prior Publication Data

US 2019/0287961 A1    Sep. 19, 2019

(30) Foreign Application Priority Data

Mar. 16, 2018 (JP) .............................. JP2018-049628

(51) Int. Cl.
    *H01L 29/66*    (2006.01)
    *H01L 21/332*   (2006.01)
    (Continued)

(52) U.S. Cl.
    CPC .......... *H01L 27/0635* (2013.01); *G01K 7/01* (2013.01); *H01L 29/0696* (2013.01); *H01L 29/0804* (2013.01); *H01L 29/0821* (2013.01); *H01L 29/1079* (2013.01); *H01L 29/36* (2013.01); *H01L 29/4236* (2013.01); *H01L 29/42376* (2013.01); *H01L 29/66325* (2013.01); *H01L 29/66348* (2013.01); *H01L 29/7395* (2013.01);
    (Continued)

(58) Field of Classification Search
    CPC ..... H01L 29/66325; H01L 2924/13055; H01L 27/0635; H01L 29/0696; H01L 29/0804; H01L 29/0821; H01L 29/1079; H01L 29/36; H01L 29/4236; H01L 29/42376; H01L 29/7397
    See application file for complete search history.

(56) References Cited

U.S. PATENT DOCUMENTS 9,023,692 B2 * 5/2015 Yoshida .............. H01L 29/0696
                                                      438/133
9,761,582 B2 * 9/2017 Gejo ................... H01L 29/0834
                        (Continued)

FOREIGN PATENT DOCUMENTS

| JP | 2015156489 A  | 8/2015 |
| JP | 2017045949 A  | 3/2017 |
| WO | 2011125156 A1 | 10/2011 |

*Primary Examiner* — Alonzo Chambliss

(57) ABSTRACT

To improve the withstand capability of a transistor portion, provided is a semiconductor device including a semiconductor substrate; a transistor portion provided in the semiconductor substrate; and a diode portion provided in the semiconductor substrate and arranged adjacent to the transistor portion in a predetermined arrangement direction. The transistor portion includes a collector region provided in a bottom surface of the semiconductor substrate, at respective ends adjacent to the diode portion; and a first low injection region that is provided on a bottom surface side of the semiconductor substrate farther inward than the respective ends, and has a carrier injection density from the bottom surface side to a top surface side of the semiconductor substrate that is lower than that of the collector region.

18 Claims, 25 Drawing Sheets

(51) Int. Cl.
*H01L 21/336* (2006.01)
*H01L 27/06* (2006.01)
*H01L 29/10* (2006.01)
*H01L 29/423* (2006.01)
*H01L 29/08* (2006.01)
*H01L 29/36* (2006.01)
*H01L 29/06* (2006.01)
*H01L 29/739* (2006.01)
*G01K 7/01* (2006.01)
H01L 29/417 (2006.01)
H01L 29/49 (2006.01)
H01L 23/34 (2006.01)
H01L 29/45 (2006.01)

(52) U.S. Cl.
CPC .......... *H01L 29/7397* (2013.01); *H01L 23/34* (2013.01); *H01L 29/41708* (2013.01); *H01L 29/45* (2013.01); *H01L 29/495* (2013.01); *H01L 29/4975* (2013.01)

(56) References Cited

U.S. PATENT DOCUMENTS

| | | |
|---|---|---|
| 10,170,607 B2 | 1/2019 | Kouno |
| 2008/0093697 A1* | 4/2008 | Kaneda ................ H01L 29/861 257/492 |
| 2013/0001639 A1 | 1/2013 | Iwasaki |
| 2015/0236143 A1 | 8/2015 | Pfirsch |
| 2017/0084611 A1* | 3/2017 | Iwasaki ............... H01L 27/0727 |

\* cited by examiner

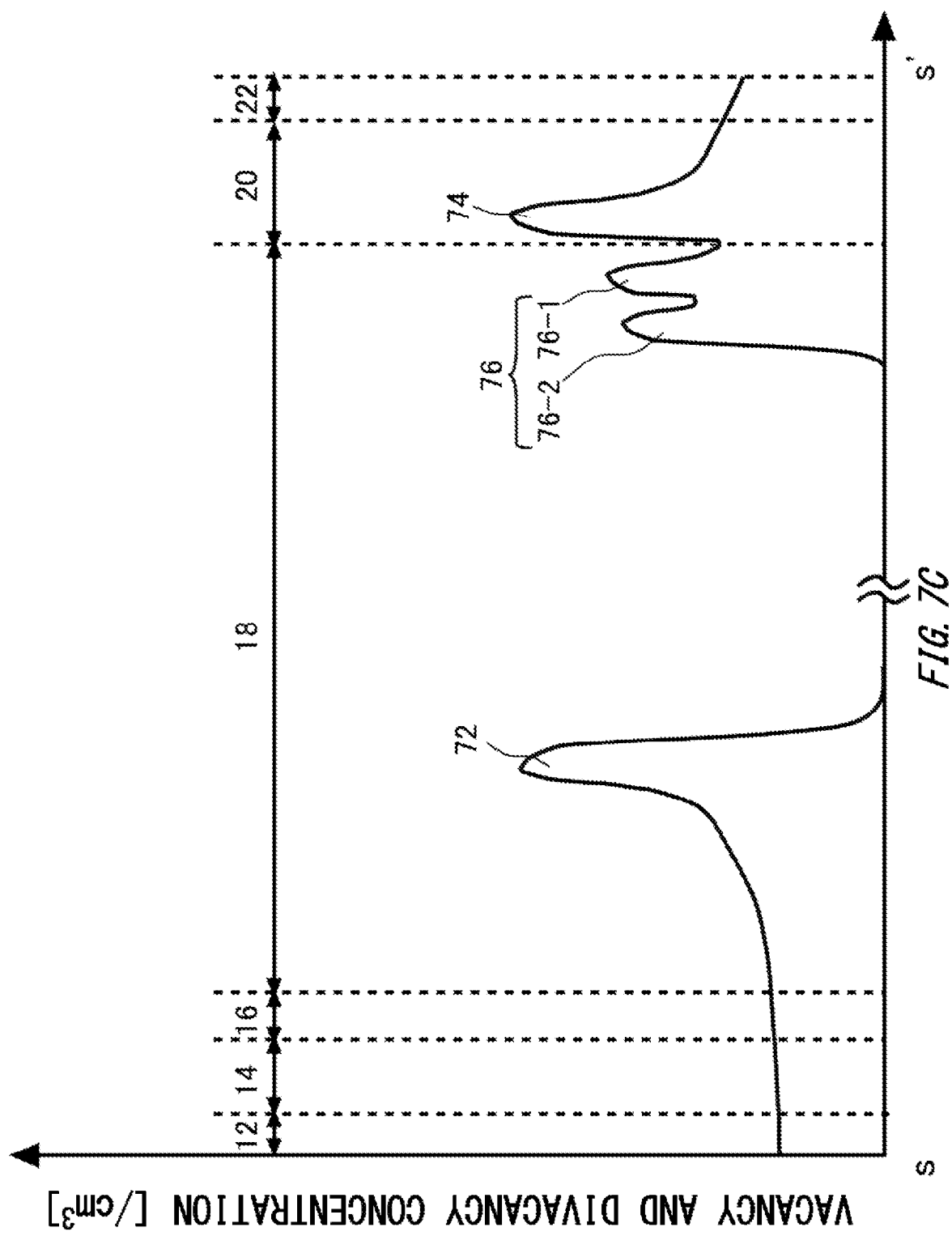

SEMICONDUCTOR DEVICE WITH TRANSISTOR PORTION HAVING LOW INJECTION REGION ON THE BOTTOM OF A SUBSTRATE

The contents of the following Japanese patent application(s) are incorporated herein by reference:
NO. 2018-49628 filed on Mar. 16, 2018.

BACKGROUND

1. Technical Field

The present invention relates to a semiconductor device.

2. Related Art

A conventional semiconductor device such as an insulated gate bipolar transistor (IGBT) is known, as shown in Patent Documents 1 and 2, for example.
Patent Document 1: Japanese Patent Application Publication No. 2015-156489
Patent Document 2: Japanese Domestic Republication of PCT International Publication No. 2011-125156
In a semiconductor device, the withstand capability of a transistor portion is preferably improved.

SUMMARY

According to a first aspect of the present invention, provided is a semiconductor device comprising a semiconductor substrate; a transistor portion provided in the semiconductor substrate; and a diode portion provided in the semiconductor substrate and arranged adjacent to the transistor portion in a predetermined arrangement direction. The transistor portion includes a collector region provided in a bottom surface of the semiconductor substrate, at respective ends adjacent to the diode portion; and a first low injection region that is provided on a bottom surface side of the semiconductor substrate farther inward than the respective ends, and has a density of carrier injection from the bottom surface side to a top surface side of the semiconductor substrate that is lower than that of the collector region.

The diode portion and the transistor portion may be arranged in an alternating manner in the arrangement direction. The first low injection region may include a center of the transistor portion in the arrangement direction.

The transistor portion may include a gate trench portion that is provided inside the semiconductor substrate from the top surface of the semiconductor substrate, and extends in an extension direction orthogonal to the arrangement direction in the top surface of the semiconductor substrate. A portion of the first low injection region may overlap with the gate trench portion, in a top view of the semiconductor substrate.

The semiconductor device may further comprise an active region in which the transistor portion and the diode portion are arranged, and through which a current flows between the top surface and the bottom surface of the semiconductor substrate; and a peripheral region provided between the active region and a peripheral edge of the semiconductor substrate, in a top view of the semiconductor substrate. A plurality of emitter regions may be provided in the extension direction in the transistor portion, in contact with the gate trench portion and the top surface of the semiconductor substrate. An end portion of the first low injection region on the peripheral region side in the extension direction may be arranged at a predetermined distance in the extension direction from the emitter region provided closest to the peripheral region, in the top view of the semiconductor substrate. The predetermined distance may be less than a diffusion length of a carrier injected through the first low injection region.

An end portion of the first low injection region on the peripheral region side in the extension direction may be provided in the peripheral region, in the top view of the semiconductor substrate. The collector region may extend in the extension direction from an end portion of the first low injection region on the peripheral region side in the extension direction to the peripheral region.

The semiconductor device may further comprise a first gate metal layer that extends in the arrangement direction and is provided adjacent to the active region; and a second gate metal layer that extends in the extension direction orthogonal to the arrangement direction, is provided adjacent to the active region, and is connected to the first gate metal layer. The active region may include a corner portion that is opposite the second gate metal layer in the arrangement direction and opposite the first gate metal layer in the extension direction that is orthogonal to the arrangement direction, in the top view of the semiconductor substrate. The transistor portion may further include a second low injection region that is provided in the corner portion on the bottom surface side of the semiconductor substrate, and has a density of carrier injection from the bottom surface side to the top surface side of the semiconductor substrate lower than that of the collector region.

A width of the first low injection region in the arrangement direction may be greater than or equal to a trench pitch in the arrangement direction and less than or equal to ⅓ of a width of the transistor portion in the arrangement direction.

The semiconductor device may further comprise a top surface side lifetime control region that is provided across the diode portion and part of the transistor portion in the arrangement direction, is provided on the top surface side of the semiconductor substrate, and includes a lifetime killer. The first low injection region does not need to overlap with the top surface side lifetime control region, in the top view of the semiconductor substrate.

The first low injection region and the collector region may have a second conductivity type. An integrated concentration obtained by integrating a doping concentration of the first low injection region in a depth direction of the semiconductor substrate may be lower than an integrated concentration obtained by integrating a doping concentration of the collector region in the depth direction of the semiconductor substrate.

The doping concentration of the first low injection region may be lower than the doping concentration of the collector region. A thickness of the first low injection region may be less than a thickness of the collector region, in the depth direction of the semiconductor substrate.

The first low injection region may include a lifetime control region that contains a lifetime killer and is provided on the bottom surface side of the semiconductor substrate. At least a portion of the first low injection region may include an injection inhibition region having a conductivity type that is the opposite of a conductivity type of the collector region.

A plurality of transistor portions, among which each transistor portion is the transistor portion, may be arranged in an extension direction orthogonal to the arrangement direction. The transistor portions at respective ends in the extension direction may each include the collector region and the first low injection region provided in the bottom surface of the semiconductor substrate. Each transistor portion that is not at a respective end may include the collector region provided in the bottom surface of the semiconductor substrate, but does not need to include the first low injection region in the bottom surface of the semiconductor substrate.

The summary clause does not necessarily describe all necessary features of the embodiments of the present invention. The present invention may also be a sub-combination of the features described above.

BRIEF DESCRIPTION OF THE DRAWINGS

FIG. 7C shows the vacancy and divacancy concentration distribution of the top surface side lifetime control region 72, the bottom surface side lifetime control region 74, and the lifetime control region 76 in the s-s' cross section of FIG. 7B.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In the present specification, one side in a direction parallel to a depth direction of the semiconductor substrate is referred to as "top", and the other side is referred to as "bottom". Among the two main surfaces of the substrate, layers, and other components, one surface is referred to as a top surface, and the other surface is referred to as a bottom surface. The "up" and "down" directions are not limited to the direction of gravity or the direction in which the semiconductor device is attached to the substrate or the like when implemented.

In the present specification, there are cases where technical concepts are described using orthogonal coordinate axes that are the X axis, the Y axis, and the Z axis. In the present specification, the plane parallel to the top surface of the semiconductor substrate is the XY plane, and the depth direction of the semiconductor substrate is the Z axis.

In each embodiment example, an example is shown in which a first conductivity type is N type and a second conductivity type is P type, but instead, the first conductivity type may be P type and the second conductivity type may be N type. In this case, the conductivity types of each of the substrates, layers, regions, and the like in each embodiment examples are reversed.

In the present specification, the doping concentration refers to the concentration of impurities that have become donors or acceptors. In the present specification, there are cases where a difference in concentration between the donors and the acceptors is referred to as the doping concentration. Furthermore, there are cases where a peak value of a doping concentration in a doped region is referred to as the doping concentration in this doped region.

Figure 1:
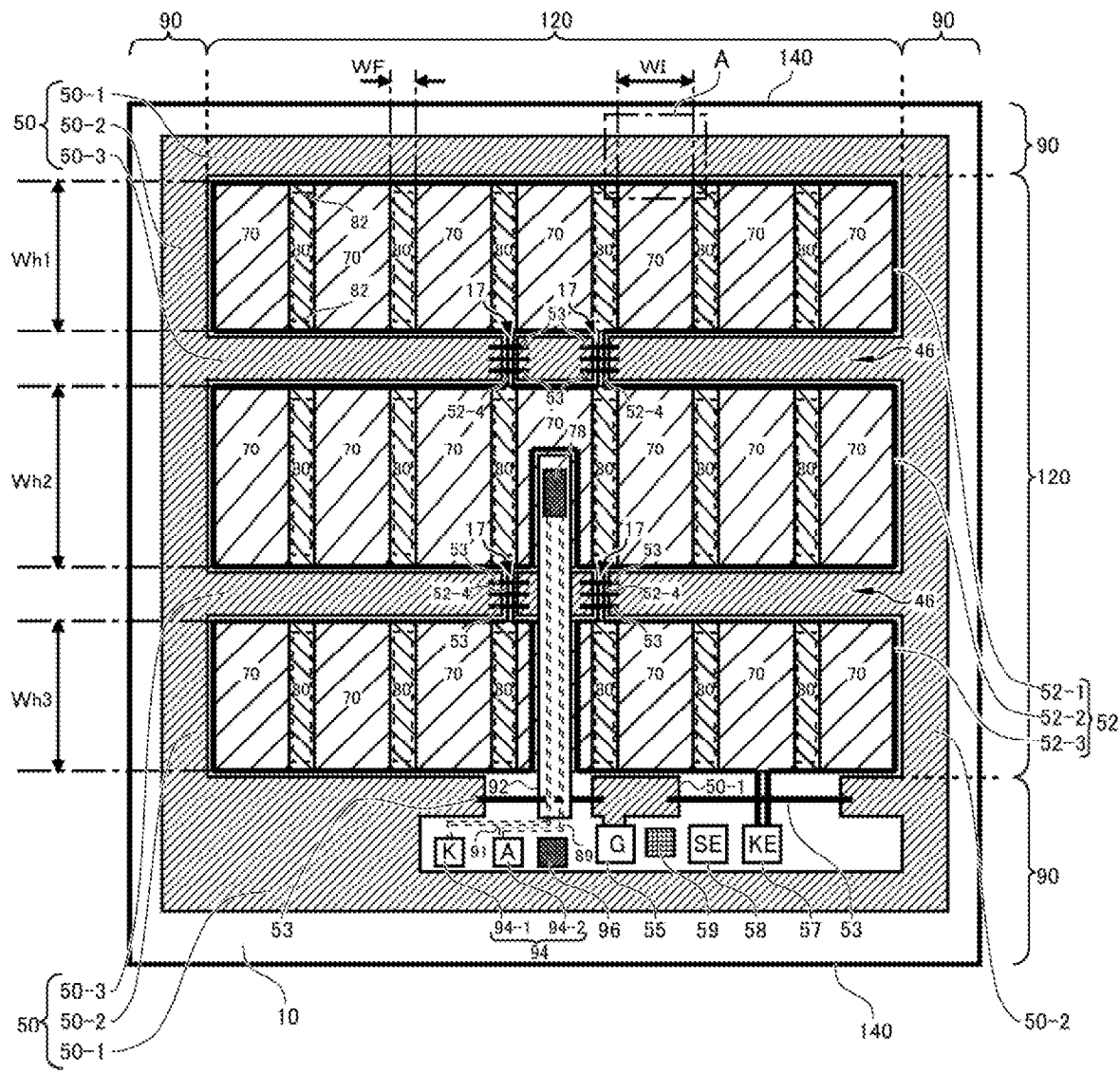
FIG. 1 shows an example of a top surface of a semiconductor device 100 according to the present embodiment.

FIG. 1 shows an example of a top surface of a semiconductor device 100 according to the present embodiment. The semiconductor device 100 of the present example is a semiconductor chip including a transistor portion 70 and a diode portion 80. The transistor portion 70 includes a transistor such as an IGBT. The diode portion 80 includes a diode such as an FWD (Free Wheel Diode). The diode portion 80 is provided adjacent to the transistor portion 70, along a predetermined arrangement direction (the Y axis direction in the present embodiment).

An active region 120 is provided in the semiconductor substrate 10. The active region 120 is a region in which a main current flows between the top surface and the bottom surface of the semiconductor substrate 10, when the semiconductor device 100 is controlled to be in an ON state. In other words, the active region 120 is a region in which current flows in the depth direction inside the semiconductor substrate 10, from the top surface to the bottom surface or from the bottom surface to the top surface of the semiconductor substrate 10. In the present specification, the transistor portion 70 and the diode portion 80 are each referred to as an element portion or element region. A region provided with an element portion may be an active region 120.

In a top view of the semiconductor substrate 10, a region sandwiched by two element portions is also an active region 120. In the example of FIG. 1, the region sandwiched between element portions where a gate metal layer 50 is provided is also included as an active region 120. The active region 120 can also be defined as a region where an emitter electrode is provided and a region sandwiched by emitter electrodes, in the top view of the semiconductor substrate 10. In the example of FIG. 1, the emitter electrode is provided above the transistor portion 70 and the diode portion 80.

In the top view of the semiconductor substrate 10, the region between the active region 120 and the peripheral edge 140 of the semiconductor substrate 10 is a peripheral region 90. The peripheral region 90 is provided surrounding the active region 120 in the top view of the semiconductor substrate 10. One or more metal pads for connecting the semiconductor device 100 and an external apparatus, with wires or the like, may be arranged in the peripheral region 90. The semiconductor device 100 may include an edge termination structure portion that surrounds the active region 120, in the peripheral region 90. The edge termination structure portion relaxes the electric field concentration on the top surface side of the semiconductor substrate 10. The edge termination structure portion includes a guard ring, a field plate, a RESURF, and a structure formed of a combination of the components, for example.

A plurality of transistor portions 70 and a plurality of diode portions 80 may be provided in the active region 120. Each diode portion 80 is provided with a cathode region 82 having the first conductivity type on the bottom surface of the semiconductor substrate 10. The cathode region 82 of the present example is $N^+$ type, for example. The cathode region 82 may be provided in a range such that the cathode region 82 does not contact the peripheral region 90 or in a manner to not enter into the peripheral region 90, as shown by the dotted-line frame of FIG. 1.

The transistor portions 70 and the diode portions 80 may be provided in an alternating manner along the predetermined arrangement direction (the Y-axis direction in the present example). In the present specification, the direction in which the transistor portions 70 and the diode portions 80 are arranged in an alternating manner is referred to as the arrangement direction (Y-axis direction). In FIG. 1, the transistor portions 70 may be provided at both ends in the Y-axis direction, i.e. in regions adjacent to the gate metal layer 50. A plurality of transistor portions 70 and a plurality of diode portions 80 may be provided in the X-axis direction. FIG. 1 shows an example in which seven transistor portions 70 are provided in the Y-axis direction and three transistor portions 70 are provided in the X-axis direction, and six diode portions 80 are provided in the Y-axis direction and three diode portions 80 are provided in the X-axis direction.

The width Wh1 is the width in the X-axis direction of each transistor portion 70 and diode portion 80 provided on the side farthest in the positive X-axis direction in FIG. 1. The width Wh3 is the width in the X-axis direction of each transistor portion 70 and diode portion 80 provided on the side farthest in the negative X-axis direction in FIG. 1. The width Wh1 and the width Wh3 may be the same. In the present specification, there are cases where relative positions in each axial direction are referred to as being on the positive side or the negative side. In each drawing, the arrow mark of each axis points to the positive side, and the opposite side is the negative side.

The width Wh2 is the width in the X-axis direction of the transistor portion 70 and diode portion 80 provided in the middle in the X-axis direction in FIG. 1. The width Wh1 may be less than the width Wh2.

The width WI is the width of each transistor portion 70 in the Y-axis direction. The width WF is the width of each diode portion 80 in the Y-axis direction. The width WI may be greater than the width WF. The width WI may be greater than or equal to twice the width WF and less than or equal to five times the width WF. The width WI is three times the width WF, for example.

The width WI may be greater than or equal to z1200 μm and less than or equal to 1800 μm. The width WI is 1500 μm, for example. The width WF may be greater than or equal to 100 μm and less than or equal to 900 μm. The width WF is 500 μm, for example.

A dividing section 46 may be provided in the active region 120. The dividing section 46 is a region dividing the active region 120, in the top view of the semiconductor substrate 10. The dividing section 46 of the present example divides the active region 120 into a plurality of regions in the X-axis direction. The dividing section 46 may divide the emitter electrode, in the top view of the semiconductor substrate 10. The dividing section 46 may be a region having a width in the X-axis direction. In the present example, a gate metal layer 50-2 and a gate runner 53 are provided in the dividing section 46.

A plurality of transistor portions 70 and a plurality of diode portions 80 may be provided in an alternating manner in the Y-axis direction in each region of the active region 120 resulting from the division by the dividing section 46. In the example shown in FIG. 1, dividing sections 46 are provided at two different positions in the X-axis direction. In this case, the dividing sections 46 divide the active region 120 into three regions in the X-axis direction.

The gate metal layer 50 may include two gate metal layers 50-1 extending in the Y-axis direction, two gate metal layers 50-2 extending in the X-axis direction, and a gate metal layer 50-3 extending in the Y-axis direction provided in the dividing section 46. The gate metal layer 50-1 and the gate metal layer 50-2 may be connected to each other. The gate metal layer 50-2 and the gate metal layer 50-3 may be connected to each other. The gate metal layer 50-1, the gate metal layer 50-2, and the gate metal layer 50-3 may be formed integrally.

The gate metal layer 50 may be provided in a manner to surround the active region 120, in the top view of the semiconductor substrate 10. The gate metal layer 50 is electrically connected to a gate pad 55 provided outside the active region 120. The gate metal layer 50 may be provided along the peripheral edge 140 of the semiconductor substrate 10. The gate pad 55 may be arranged between the gate metal layer 50 and the active region 120, in the X-axis direction.

The gate metal layer 50 is formed of a material including metal. The gate metal layer 50 may be formed of aluminum or an aluminum-silicon alloy. The gate metal layer 50 is electrically connected to the transistor portions 70, and supplies a gate voltage to the transistor portions 70.

The gate runner 53 is electrically connected to the gate metal layer 50-3, and extends to above the active region 120. The gate runner 53 electrically connects the gate metal layer 50-3 and a conductive portion such as polysilicon provided in trenches of gate trench portions (see FIG. 2A) of the transistor portions 70.

The gate runner 53 is formed of a conductive material such as polysilicon. The resistivity of the gate runner 53 may be higher than the resistivity of the gate metal layer 50. In a case where the gate metal layer 50 is formed of aluminum and the gate runner 53 is formed of polysilicon, the resistivity of the gate runner 53 is higher that the resistivity of the gate metal layer 50 by 1 to 2 orders of magnitude.

The temperature sensing section 78 is provided above the active region 120. The temperature sensing section 78 may be provided in the center of the active region 120, in the top view of the semiconductor substrate 10. The temperature sensing section 78 senses the temperature of the active region 120. The temperature sensing section 78 may be a pn type temperature sensing diode formed of monocrystalline or polycrystalline silicon.

The temperature sensing wire 92 is provided above the active region 120, in the top view of the semiconductor substrate 10. The temperature sensing wire 92 is connected to the temperature sensing section 78. The temperature sensing wire 92 extends in a predetermined direction to the peripheral region 90, and is connected to the temperature measurement pad 94 provided in the peripheral region 90. The temperature sensing wire 92 may include a wire 89 of an anode electrode electrically connected to the p type layer of the pn type temperature sensing diode, and a wire 91 of a cathode electrode electrically connected to an n type layer of the pn type temperature sensing diode. In FIG. 1, the temperature sensing wire 92 is shown by a rectangular shape formed by solid lines, but the temperature sensing wire 92 may be arranged in the manner of the wire 89 or the wire 91 shown by the dotted lines in FIG. 1. The wire 89 and the wire 91 are examples of specific leads of the temperature sensing wire 92.

The temperature measurement pad 94 includes a temperature measurement cathode pad 94-1 and a temperature measurement anode pad 94-2. The current flowing from the temperature measurement cathode pad 94-1 flows through the temperature sensing section 78 via the temperature sensing wire 92. The temperature sensing section 78 outputs a current based on the temperature sensing result, and this current is input to the temperature measurement anode pad 94-2 via the temperature sensing wire 92. The sensing section 96 is provided as a backup to the temperature sensing section 78.

The gate metal layer 50-3 is provided extending in the Y-axis direction in the dividing section 46. It should be noted that the gate metal layer 50-3 is separated into a plurality of regions arranged along the Y-axis direction. The gate runner 53 connects the gate metal layers 50-3 that have been separated along the Y-axis direction to each other, in the dividing sections 46. A plurality of gate runners 53 in the X-axis direction may be provided in a single dividing section 46. In the present example, three gate runners 53 are provided in the X-axis direction. A plurality of gate runners 53 are preferably provided in the X-axis direction in order to reduce the connection resistance between the gate metal layers 50-3 connected by the gate runners 53.

The gate pad 55 is arranged at a distance from the active region 120 in the X-axis direction. The gate runner 53 may be provided between the gate pad 55 and the active region 120, in the peripheral region 90. A gate runner 53 provided in the peripheral region 90 may intersect with the temperature sensing wire 92, in the top view of the semiconductor substrate 10. This gate runner 53 is provided passing in the Y-axis direction below the temperature sensing wire 92. Both ends of this gate runner 53 are connected to the gate metal layer 50-3.

The semiconductor device 100 includes an emitter electrode 52 above the active region 120. In FIG. 1, the region where the emitter electrode 52 is provided is shown by thick lines. A Kelvin pad 57 is provided in the peripheral region 90. The Kelvin pad 57 is electrically connected to the emitter electrode 52.

The emitter electrode 52 is formed of a material including metal. The emitter electrode 52 may be formed of aluminum or an aluminum-silicon alloy. The emitter electrode 52 is electrically connected to an emitter region of the transistor portion 70. The emitter region is described in FIG. 2A.

A gap 17 for connecting emitter electrodes 52 to each other is provided in the gate metal layer 50-3 that is provided in the dividing section 46. In the example of FIG. 1, an emitter electrode 52-1 and an emitter electrode 52-2 are separated by a dividing section 46, and the emitter electrode 52-2 and an emitter electrode 52-3 are separated by a dividing section 46. Emitter bridges 52-4 are provided in the gaps 17. The emitter bridges 52-4 connect the emitter electrode 52-1 and the emitter electrode 52-2. Furthermore, the emitter bridges 52-4 connect the emitter electrode 52-2 and the emitter electrode 52-3. The emitter bridges 52-4 are provided farther upward than the gate runners 53. The emitter bridges 52-4 and the gate runners 53 do not contact each other.

A current sensing pad 58 and a current sensing section 59 are further provided in the peripheral region 90. The current sensing pad 58 is a pad for measuring the current flowing through the current sensing section 59. The current sensing section 59 senses the current flowing through the gate pad 55.

Figure 2A:
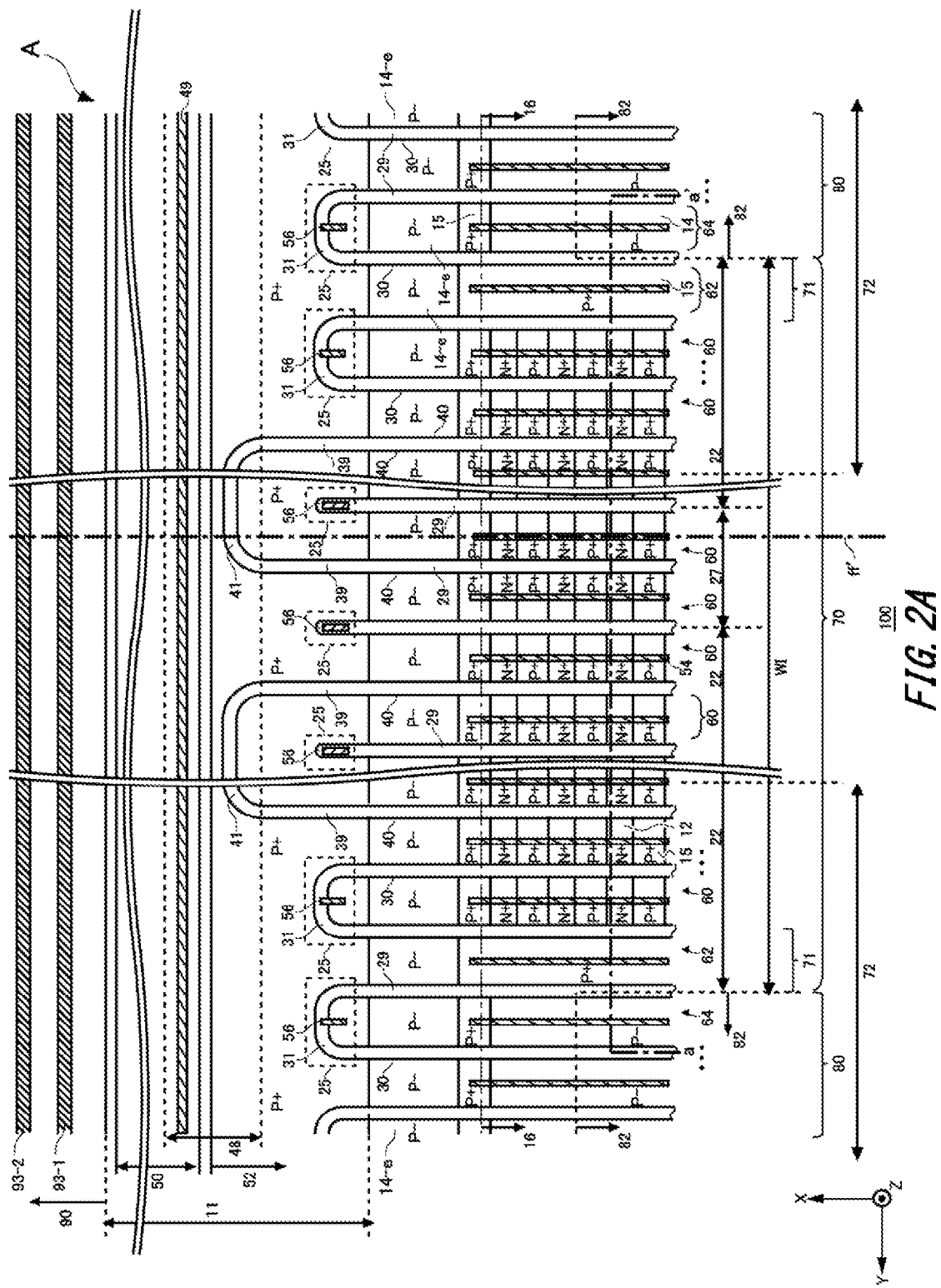
FIG. 2A is an enlarged view of the region A in FIG. 1.

FIG. 2A is an enlarged view of the region A in FIG. 1. FIG. 2A is an enlarged view of a transistor portion 70, a portion of a diode portion 80 contacting the positive side, in the Y-axis direction, of this transistor portion 70, and a portion of a diode portion 80 contacting the negative side, in the Y-axis direction, of this transistor portion 70.

The semiconductor device 100 of the present example is provided inside the semiconductor substrate 10, and includes a gate trench portion 40, a dummy trench portion 30, a well region 11, an emitter region 12, a base region 14, and a contact region 15 exposed in the top surface of the semiconductor substrate 10. Furthermore, the semiconductor device 100 of the present example includes an emitter electrode 52 and a gate metal layer 50 provided above the top surface of the semiconductor substrate 10. The emitter electrode 52 and the gate metal layer 50 are provided separated from each other.

An interlayer dielectric film is provided between the emitter electrode 52 and gate metal layer 50 and the top surface of the semiconductor substrate 10, but is not shown in FIG. 2A. A contact hole 56, a contact hole 49, and a contact hole 54 are provided in the interlayer dielectric film, penetrating therethrough.

The emitter electrode 52 is connected to a dummy conducting portion in the dummy trench portion 30, through the contact hole 56. A connecting section 25 formed of a conductive material such as polysilicon doped with impurities may be provided between the emitter electrode 52 and the dummy conducting portion. A dielectric film such as an oxide film is provided between the connecting section 25 and the top surface of the semiconductor substrate 10.

The gate metal layer 50 contacts a gate runner 48, through the contact hole 49. The gate runner 48 is formed of silicon or the like doped with impurities. The gate runner 48 is connected to a gate conducting portion inside a gate trench portion 40, on the top surface of the semiconductor substrate 10. The gate runner 48 is not connected to the dummy conducting portion inside the dummy trench portion 30.

The gate runner 48 of the present example is formed from below the contact hole 49 to an edge portion of the gate trench portion 40. A dielectric film such as an oxide film is formed between the gate runner 48 and the top surface of the semiconductor substrate 10.

At the edge portion of the gate trench portion 40, the gate conducting portion is exposed in the top surface of the semiconductor substrate 10. In other words, at least part of the top end of the gate conducting portion is not covered by the material forming the semiconductor substrate. The top end of the gate conducting portion may be arranged farther downward than the top surface of the semiconductor substrate. The gate trench portion 40 contacts the gate runner 48, at the portion thereof where the gate conducting portion is exposed.

The emitter electrode 52 and the gate metal layer 50 are formed of a material including metal. At least a partial region of the emitter electrode 52 may be formed of aluminum or an aluminum-silicon alloy.

At least a partial region of the gate metal layer 50 may be formed of aluminum or an aluminum-silicon alloy. The emitter electrode 52 and the gate metal layer 50 may include barrier metal formed of titanium, a titanium compound, or the like in the bottom layer of the region formed of aluminum or the like. Furthermore, the emitter electrode 52 and the gate metal layer 50 may include a plug formed of tungsten or the like, within the contact hole.

One or more gate trench portions 40 and one or more dummy trench portions 30 are arranged at predetermined intervals along the predetermined arrangement direction (Y-axis direction in the present example). Each gate trench portion 40 of the present example may include two extending portions 39 that extend along an extension direction (X-axis direction in the present example) that is parallel to the top surface of the semiconductor substrate 10 and perpendicular to the arrangement direction, and a connecting portion 41 that connects the two extending portions 39. At least part of the connecting portion 41 is preferably formed with a curved shape in the top view. By connecting the end portions of the two extending portions 39 of the gate trench portion 40, it is possible to relax the electric field concentration at the end portion of the extending portion 39. In the present specification, there are cases where each extending portion 39 of the gate trench portion 40 is treated as a single gate trench portion 40. The gate runner 48 may connect to the gate conducting portion at the connecting portion 41 of the gate trench portion 40.

Each dummy trench portion 30 of the present example may be U-shaped in the top view of the semiconductor substrate 10, in a similar manner as the gate trench portion 40. Specifically, the dummy trench portion 30 may include two extending portions 29 that extend along the extension direction and a connecting portion 31 that connects the two extending portions 29.

The emitter electrode 52 is formed above the gate trench portion 40, the dummy trench portion 30, the well region 11, the emitter region 12, the base region 14, and the contact region 15. The well region 11 has the second conductivity type. The well region 11 is $P^+$ type, for example. The well region 11 is formed in a predetermined range from the end portion of the active region 120, in the top view. The diffusion depth of the well region 11 may be greater than the depths of the gate trench portion 40 and the dummy trench portion 30. The well region 11 may be provided farther inside the active region than the gate metal layer 50. The end portions of the gate trench portion 40 and the dummy trench portion 30 in the extension direction are formed in the well region 11. The bottoms of these end portions of the gate trench portion 40 and the dummy trench portion 30 may be covered by the well region 11.

Mesa portions contacting each trench portion are provided in the Y-axis direction, in a plane parallel to the top surface of the semiconductor substrate 10. Each mesa portion is a portion of the semiconductor substrate 10 sandwiched between two adjacent trench portions. Each mesa portion may be a portion from the top surface of the semiconductor substrate 10 to a depth of the deepest bottom portion of the trench portions. A region sandwiched by two adjacent extending portions (29 or 39) may be a mesa portion.

In the transistor portion 70, a first mesa portion 60 is provided contacting each trench portion. At a boundary portion 71, a second mesa portion 62 is provided in the region sandwiched by adjacent dummy trench portions 30. In the diode portion 80, a third mesa portion 64 is provided in the region sandwiched by adjacent dummy trench portions 30.

Both ends in the X-axis direction of each of the first mesa portion 60, the second mesa portion 62, and the third mesa portion 64 are provided with a base region 14-e having the second conductivity type, for example. The base region 14-e is exposed on the top surface of the semiconductor substrate. The base region 14 of the present example is $P^-$ type, for example. FIG. 1 shows only the X-axis direction end portion of each mesa portion.

The emitter region 12 contacting the gate trench portion 40 is provided on the top surface of the first mesa portion 60. The emitter region 12 may be provided from one of two trench portions (the extending portions 29 or 39 in the present example) sandwiching the first mesa portion 60 to the other. The emitter region 12 is provided below the contact hole 54 as well.

The emitter region 12 may contact the dummy trench portion 30, but does not need to contact the dummy trench portion 30. In the present example, the emitter region 12 is provided contacting the dummy trench portion 30. The emitter region 12 of the present example has the first conductivity type. The emitter region 12 of the present example is $N^+$ type, for example.

The contact region 15 having the second conductivity type and a higher doping concentration than the base region 14 is provided on the top surface of the first mesa portion 60. The contact region 15 of the present example is $P^+$ type, for example. In the first mesa portion 60, the emitter region 12 and the contact region 15 may be provided in an alternating manner in the extension direction of the gate trench portion 40. The contact region 15 may be provided from one of the two trench portions sandwiching the first mesa portion 60 to the other. The contact region 15 is also provided below the contact hole 54.

The contact region 15 may contact the gate trench portion 40, but does not need to contact the gate trench portion 40. Furthermore, the contact region 15 may contact the dummy trench portion 30, but does not need to contact the dummy trench portion 30. In the present example, the contact region 15 is provided contacting the dummy trench portion 30 and the gate trench portion 40.

The contact region 15 is provided on the top surface of the second mesa portion 62. The surface area of the contact region 15 provided on the top surface of one second mesa portion 62 is greater than the surface area of the contact region 15 provided on the top surface of one first mesa portion 60. The surface area of the contact region 15 provided on the top surface of one second mesa portion 62 may be greater than the surface area of the contact region 15 provided on the top surface of one third mesa portion 64. In the second mesa portion 62, the contact region 15 may also be provided below the contact hole 54.

The contact region 15 on the top surface of the second mesa portion 62 may be provided on the entire region sandwiched by two base regions 14-e in the X-axis direction. In the second mesa portion 62, the carriers are more easily drawn out during turn-OFF than in the first mesa portion 60.

The contact region 15 is provided at both X-axis direction end portions on the top surface of the third mesa portion 64. Furthermore, the base region 14 is provided in the region sandwiched by the contact regions 15 at these end portions on the top surface of the third mesa portion 64. The base region 14 may be provided on the entire region sandwiched by these contact regions 15 in the X-axis direction. In the third mesa portion 64, base region 14 is also provided below the contact hole 54. The contact region 15 may also be provided below the contact hole 54.

In the third mesa portion 64, the contact region 15 and the base region 14 are formed from one of the dummy trench portions 30 sandwiching the third mesa portion 64 across to the other dummy trench portion 30. In other words, on the top surface of the semiconductor substrate 10, the width in the Y-axis direction of the third mesa portion 64 and the width in the Y-axis direction of the contact region 15 or the base region 14 provided in the third mesa portion 64 are equal.

A second contact region (not shown in the drawings) with a higher doping concentration than the contact region 15 may be formed, in contact with the contact hole 54, on the top surface of the contact region 15 of each of the first mesa portion 60, the second mesa portion 62, and the third mesa portion 64. As an example, the second contact region is $P^{++}$ type. The second contact region may be shallower than the contact region 15.

The emitter region 12 does not need to be formed, but may be formed, in the third mesa portion 64. In the present example, the emitter region 12 is not formed in the third mesa portion 64.

In the semiconductor device 100 of the present example, the dummy trench portion 30 is formed in the diode portion 80. The dummy trench portion 30 includes the extending portions 29. Two adjacent extending portions 29 may be connected by the connecting portion 31. Each third mesa portion 64 is a region sandwiched by a dummy trench portion 30 (extending portions 29 in the present example).

The diode portion 80 includes a cathode region 82 having the first conductivity type on the bottom surface side of the semiconductor substrate 10. The cathode region 82 of the present example is $N^+$ type, for example. FIG. 1 shows the region where the cathode region 82 is provided, in the top view of the semiconductor substrate 10, with broken lines. The diode portion 80 may be a region through which the cathode region 82 passes, when the cathode region 82 is projected onto the top surface of the semiconductor substrate 10. Furthermore, the diode portion 80 may include the entire third mesa portion 64 in which the cathode region 82 is partially provided and the dummy trench portion 30 contacting this third mesa portion 64. The region where the cathode region 82 is projected onto the top surface of the semiconductor substrate 10 may be distanced from the contact region 15 in the X-axis direction. In the third mesa portion 64, the distance in the X-axis direction between the cathode region 82 and the well region 11 is greater than the distance in the X-axis direction between the contact region 15 and the well region 11.

The transistor portion 70 includes a collector region 22 at both ends thereof in the Y-axis direction, provided on the bottom surface side of the semiconductor substrate 10. The collector region 22 of the present example has the second conductivity type. The collector region 22 of the present example is $P^+$ type, for example. The collector region 22 may be provided in contact with the cathode region 82. In FIG. 2A, the region in which the collector region 22 is provided is shown by the single-dot dashed line portion, in the top view of the semiconductor substrate 10.

The transistor portion 70 includes a first low injection region 27 farther inward than the ends in the Y-axis direction, provided on the bottom surface side of the semiconductor substrate 10. In other words, the first low injection region 27 may be provided sandwiched in the Y-axis direction between the collector regions 22 provided at the respective ends of the transistor portion 70, on the bottom surface side of the semiconductor substrate 10. The carrier injection density from the bottom surface side to the top surface side of the semiconductor substrate 10 of the first low injection region 27 is lower than this carrier injection density of the collector region 22.

The carrier injection density in the transistor portion 70 may be the carrier density of holes or electrons when the gate is ON and the semiconductor device is conducting. In particular, the carrier injection density may be the carrier density on the bottom surface side of the center in the depth direction of the semiconductor substrate.

The first low injection region 27 may include the center of the transistor portion 70 in the arrangement direction (Y-axis direction). In other words, the first low injection region 27 may include the center, in the arrangement direction (Y-axis direction), of the region between the boundary between the transistor portion 70 and the diode portion 80 contacting one end portion of this transistor portion 70 and the boundary between this transistor portion 70 and the diode portion 80 contacting the other end portion of this transistor portion 70.

The first low injection region 27 may include the gate trench portion 40 that is closest to the center, in the Y-axis direction, of the region between the boundary between the transistor portion 70 and the diode portion 80 contacting one end portion of this transistor portion 70 and boundary between this transistor portion 70 and the diode portion 80 contacting the other end portion of this transistor portion 70. This gate trench portion 40 closest to this center also includes a case where the position of the gate trench portion 40, in the Y-axis direction, overlaps with this center position.

The first low injection region 27 may be a region including the first mesa portion 60 closest to the center, in the Y-axis direction, of the region between the boundary between the transistor portion 70 and the diode portion 80 contacting one end portion of this transistor portion 70 and the boundary between this transistor portion 70 and the diode portion 80 contacting the other end portion of this transistor portion 70. The mesa portion 60 closest to this center also includes a case in which the position of the first mesa portion, in the Y-axis direction, overlaps with this center.

The first low injection region 27 may include the center of the transistor portion 70 in the arrangement direction (Y-axis direction). In other words, the first low injection region 27 may include, in the X-axis direction, the emitter region 12 closest to the center between one end and the other end of the transistor portion 70. The emitter region 12 closest to this center includes the case of an emitter region whose position overlaps, in the X-axis direction, with this center position.

A portion of the first low injection region 27 may be provided overlapping with the gate trench portion 40, in the top view of the semiconductor substrate 10. A portion of the first low injection region 27 may be provided overlapping with one gate trench portion 40 or with a plurality of gate trench portions 40, in the top view of the semiconductor substrate 10. FIG. 2A shows an example in which the first low injection region 27 overlaps with a plurality of gate trench portions 40, in the top view of the semiconductor substrate 10.

In the transistor portion 70, the contact hole 54 is formed above each of the contact region 15 and the emitter region 12, except at the boundary portion 71. The contact hole 54 may be provided continuously from above the contact region 15 provided on the most negative X-axis direction side of the first mesa portion 60 to the contact region 15 provided on the most positive X-axis direction side, in the top view of FIG. 2A, in a portion of or all of the transistor portion 70. The contact hole 54 may be provided overlapping with at least a portion of the contact region 15 provided on the most negative X-axis direction side of the first mesa portion 60, in the top view of FIG. 2A. The contact hole 54 may be provided overlapping with at least a portion of the contact region 15 provided on the most positive X-axis direction side of the first mesa portion 60, in the top view.

In the boundary portion 71, the contact hole 54 is formed above the contact region 15. In the second mesa portion 62, at the boundary portion 71, the contact hole 54 may be provided above the contact region 15 of the second mesa portion 62, in the top view of FIG. 2A.

In the diode portion 80, the contact hole 54 is formed above the base region 14 and the contact region 15. In the diode portion 80, the contact hole 54 may be provided continuously from above the contact region 15 provided on the most negative X-axis direction side of the third mesa portion 64 to above the contact region 15 provided on the most positive X-axis direction side of the third mesa portion 64, in the top view of FIG. 2A. The contact hole 54 may be provided overlapping with at least a portion of the contact region 15 provided on the negative X-axis direction side of the third mesa portion 64, in the top view of FIG. 2A. The contact hole 54 may be provided overlapping with at least a portion of the contact region 15 provided on the positive X-axis direction side of the third mesa portion 64, in the top view of FIG. 2A.

In the semiconductor device 100 of the present example, an accumulation region 16 having the first conductivity type may be provided below the base region 14 inside the semiconductor substrate 10. The accumulation region 16 of the present example is $N^+$ type, for example. In FIG. 1, the range in which the accumulation region 16 is provided is shown by dashed lines. The end portion of the accumulation region 16 in the X-axis direction may be arranged farther inward in the X-axis direction than the end portion of the contact hole 54 in the X-axis direction. Inward in the X-axis direction refers to the side closer to the center of each mesa portion in the X-axis direction. The accumulation region 16 is a region in which the dopant is accumulated with a higher density than in the drift region 18.

In the semiconductor device 100 of the present example, the gate trench portions 40 and the dummy trench portions 30 are provided in an alternating manner, one at a time, in the Y-axis direction. In other words, one dummy trench portion 30 is provided sandwiched by two gate trench portions 40 in the Y-axis direction. Furthermore, one gate trench portion 40 is provided sandwiched by two dummy trench portions 30 in the Y-axis direction. Alternatively, a plurality of dummy trench portions 30 may be provided sandwiched by two gate trench portions 40, or a plurality of gate trench portions 40 may be provided sandwiched by two dummy trench portions 30.

In the semiconductor device 100 of the present example, a top surface side lifetime control region 72 including a lifetime killer is provided locally in the depth direction of the semiconductor substrate 10. In FIG. 2A, the region in which the top surface side lifetime control region 72 is provided, in the top view of the semiconductor substrate 10, is shown by dashed lines. As shown in FIG. 2A, the top surface side lifetime control region 72 may be provided continuously in the Y-axis direction from the diode portion 80 to the transistor portion 70. The top surface side lifetime control region 72 may be provided to a region overlapping the gate trench portion 40 closest to the diode portion 80, in the transistor portion 70.

The top surface side lifetime control region 72 may be provided across the entire diode portion 80 in the Y-axis direction. In other words, the top surface side lifetime control region 72 may be provided across the entirety of a diode portion 80 in the Y-axis direction, from a portion of this diode portion 80 shown in FIG. 2A to a remaining portion of this diode portion 80 that is not shown in FIG. 2A.

The top surface side lifetime control region 72 may be provided to include the entirety of a diode portion 80 in the Y-axis direction, from a portion of the transistor portion 70 in FIG. 2A to a portion of another transistor portion 70 contacting the positive Y-axis direction side of this diode portion 80, through this diode portion 80 contacting the positive Y-axis direction side of this transistor portion 70, in the Y-axis direction.

The top surface side lifetime control region 72 may be provided to include the entirety of a diode portion 80 in the Y-axis direction, from a portion of the transistor portion 70 in FIG. 2A to a portion of another transistor portion 70 contacting the negative Y-axis direction side of this diode portion 80, through this diode portion 80 contacting the negative Y-axis direction side of this transistor portion 70, in the Y-axis direction.

A guard ring 93-1 and a guard ring 93-2 may be provided in the peripheral region 90. Two or more guard rings may be provided.

In FIG. 2A, the single-dot chain line portion ff' is a line passing through the contact holes 54 in the X-axis direction. The single-dot chain line portion ff' is explained in detail below in the description of FIG. 11.

Figure 2B:
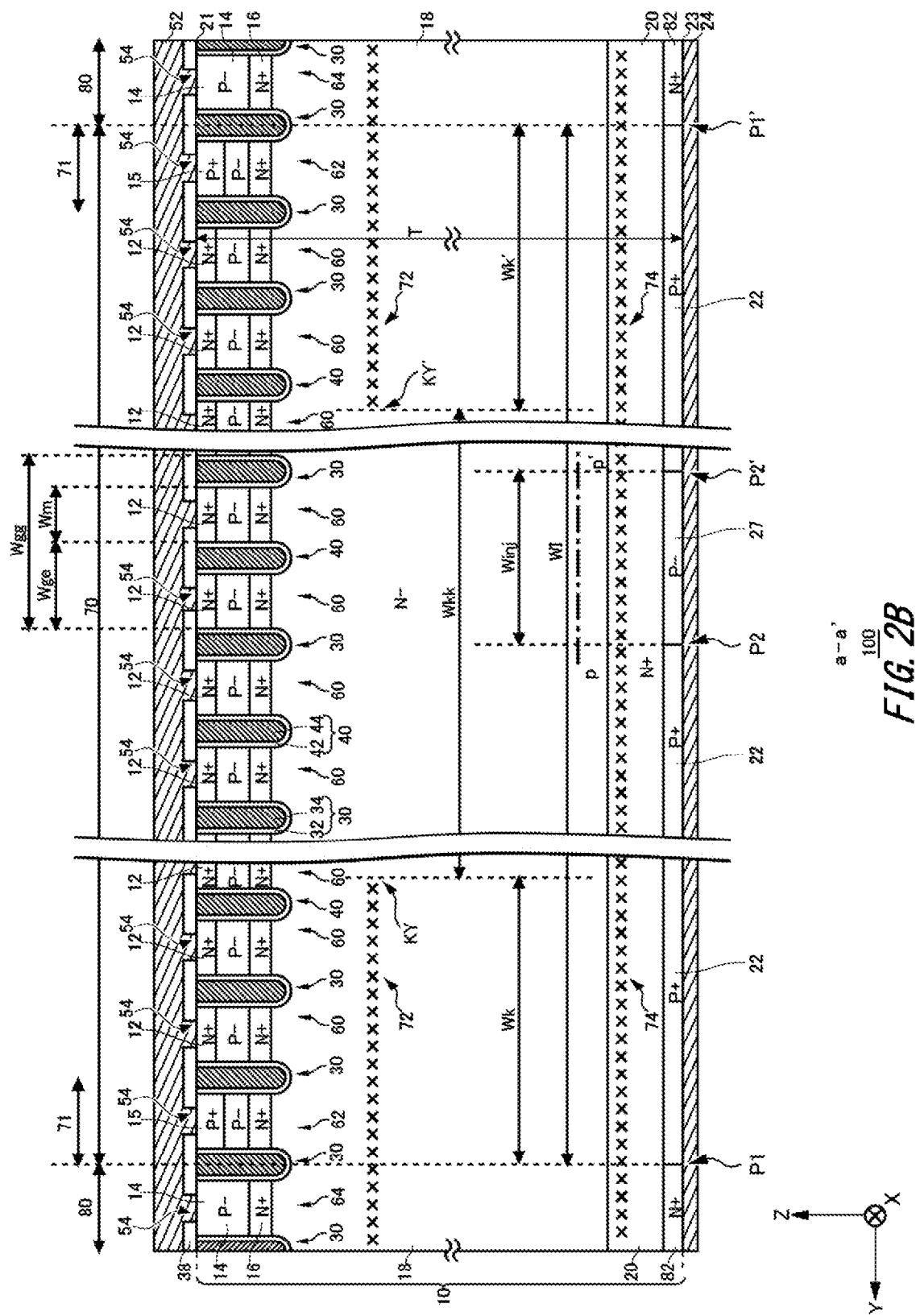
FIG. 2B shows an example of the cross section along the line a-a' in FIG. 2A.

FIG. 2B shows an example of a cross section along the line a-a' in FIG. 2A. The a-a' cross section is the YZ plane passing through the emitter regions 12 and the contact regions 15 in the transistor portion 70 and the base regions 14 of the diode portions 80. The semiconductor device 100 of the present example includes the semiconductor substrate 10, the interlayer dielectric film 38, the emitter electrode 52, and the collector electrode 24 in the a-a' cross section. The emitter electrode 52 is provided on the top surface 21 of the semiconductor substrate 10 and the top surface of the interlayer dielectric film 38. The collector electrode 24 is provided on the bottom surface 23 of the semiconductor substrate 10. The emitter electrode 52 and the collector electrode 24 are formed of a conductive material such as metal.

The semiconductor substrate 10 may be a silicon substrate, a silicon carbide substrate, a nitride semiconductor substrate such as a gallium nitride semiconductor substrate, or the like. The semiconductor substrate 10 of the present example is a silicon substrate.

The semiconductor substrate 10 includes a drift region 18 having a first conductivity type. The drift region 18 of the present example is N⁻ type, for example. The drift region 18 may be a region in the semiconductor substrate 10 left free of other doped regions.

One or more gate trench portions 40 and one or more dummy trench portions 30 are provided at the top surface 21 of the semiconductor substrate 10. Each trench portion is provided penetrating from the top surface 21 through the base region 14 and reaching the drift region 18.

The gate trench portion 40 includes a gate trench provided at the top surface 21, as well as a gate insulating film 42 and a gate conducting portion 44 provided inside the gate trench. The top end of the gate trench may be at the same position as the top surface 21 in the Z-axis direction. The gate insulating film 42 is provided covering the inner wall of the gate trench. The gate insulating film 42 may be formed by oxidizing or nitriding the semiconductor body of the inner wall of the gate trench. The gate conducting portion 44 is provided within the gate trench and on the inner side relative to the gate insulating film 42. In other words, the gate insulating film 42 provides insulation between the gate conducting portion 44 and the semiconductor substrate 10. The gate conducting portion 44 is formed of a conductive material such as polysilicon.

The gate conducting portion 44 is surrounded by the gate insulating film 42 inside the gate trench portion 40. The gate conducting portion 44 includes, in the depth direction of the semiconductor substrate 10, a region at which it faces the base region 14 with the gate insulating film 42 being sandwiched therebetween. The gate trench portion 40 in this cross section is covered by the interlayer dielectric film 38 on the top surface 21. When a predetermined voltage is applied to the gate conducting portion 44, a channel is formed due to an electron inversion layer in the front surface of the interface where the base region 14 contacts the gate trench.

The dummy trench portion 30 may have the same structure as the gate trench portion 40 in this cross section. The dummy trench portion 30 includes a dummy trench provided on the top surface 21 side, as well as a dummy insulating film 32 and a dummy conducting portion 34 provided in the dummy trench. The top end of the dummy trench may be at the same position as the top surface 21 in the Z-axis direction. The dummy insulating film 32 is provided covering the inner wall of the dummy trench. The dummy conducting portion 34 is provided surrounded by the dummy insulating film 32 inside the dummy trench portion 30. The dummy insulating film 32 provides insulation between the dummy conducting portion 34 and the semiconductor substrate 10.

The dummy conducting portion 34 may be formed of the same material as the gate conducting portion 44. For example, the dummy conducting portion 34 is formed of a conductive material such as polysilicon. The dummy conducting portion 34 may have the same length as the gate conducting portion 44 in the depth direction. The bottom portions of the dummy trench portion 30 and the gate trench portion 40 may have curved shapes (curved lines in the cross-section) that are convex downwardly.

In the first mesa portion 60, one or more accumulation regions 16 are provided in contact with the gate trench portion 40, above the drift region 18. In the present example, one accumulation region 16 is provided in the Z-axis direction. In a case where a plurality of accumulation regions 16 are provided, the accumulation regions 16 may be arranged along the Z-axis direction. The accumulation region 16 is N⁺ type, for example. The doping concentration of the accumulation region 16 is higher than the doping concentration of the drift region 18. By providing the accumulation region 16, it is possible to increase the carrier injection enhancement effect (IE effect) and decrease the ON voltage.

The accumulation region 16 may be in contact with the dummy trench portion 30, or may be separated from the dummy trench portion 30, in the first mesa portion 60. FIG. 2A shows an example in which the accumulation region 16 is provided in contact with the dummy trench portion 30. The second mesa portion 62 and the third mesa portion 64 may be provided with accumulation regions 16, but do not need to be provided with accumulation regions 16. FIG. 2A shows an example in which the second mesa portion 62 and the third mesa portion 64 are provided with accumulation regions 16.

In the first mesa portion 60, the base region 14 is provided in contact with the gate trench portion 40, above the accumulation region 16. The base region 14 is N⁻ type, for example. In the first mesa portion 60, the base region 14 may be provided in contact with the dummy trench portion 30.

In the second mesa portion 62 of the boundary portion 71, the base region 14 is provided in contact with the dummy trench portion 30, above the drift region 18. In the third mesa portion 64 of the diode portion 80, the base region 14 is provided in contact with the dummy trench portion 30, above the drift region 18. In the third mesa portion 64, the base region 14 is provided in contact with the top surface 21.

In the first mesa portion 60, the emitter region 12 is provided in contact with the top surface 21 and in contact with the gate trench portion 40, in the a-a' cross section. The doping concentration of the emitter region 12 is higher than the doping concentration of the drift region 18. As shown in FIG. 2A, the emitter region 12 and the contact region 15 are provided along the X-axis direction in the first mesa portion 60. In the YZ cross-sectional plane passing through the contact region 15 of the first mesa portion 60, the contact region 15 is provided instead of the emitter region 12 of FIG. 2B. The contact region 15 is provided in contact with the top surface 21 and in contact with the gate trench portion 40.

The contact region 15 is provided in the second mesa portion 62. The contact region 15 may contact the dummy trench portion 30, but does not need to contact the dummy trench portion 30. FIG. 2A shows an example in which the contact region 15 is provided in contact with the dummy trench portion 30.

The buffer region 20 having the first conductivity type may be provided below the drift region 18. The buffer region 20 is N⁺ type, for example. The doping concentration of the buffer region 20 is higher than the doping concentration of the drift region 18. The buffer region 20 may function as a field stop layer that prevents the depletion layer, which expands from the top end of the drift region 18, from reaching the P⁺ type collector region 22 and the N⁺ type cathode region 82.

In the diode portion 80, the N⁺ type cathode region 82 exposed in the bottom surface 23 is provided below the buffer region 20. In the transistor portion 70, the first low injection region 27 and the P⁺ type collector region 22 exposed in the bottom surface 23 are provided below the buffer region 20. The collector region 22 may be provided at both Y-axis direction ends of the transistor portion 70. The first low injection region 27 may be sandwiched by the two collector regions 22 at the Y-axis direction ends of the transistor portion 70.

The carrier injection density of the first low injection region 27 from the bottom surface side to the top surface side of the semiconductor substrate 10 is lower than this carrier injection density of the collector region 22. In the present example, the first low injection region 27 may have the second conductivity type, in the same manner as the collector region 22. The first low injection region 27 of the present example is P⁻ type, for example.

The integrated concentration obtained by integrating the doping concentration of the first low injection region 27 in the Z-axis direction is lower than the integrated concentration obtained by integrating the doping concentration of the collector region 22 in the Z-axis direction. The doping concentrations of the first low injection region 27 and the collector region 22 may have a distribution in the Z-axis direction, or may be uniform in the Z-axis direction. In the present example, the first low injection region 27 is a region with a lower doping concentration than the collector region 22.

The doping concentration of the first low injection region 27 may be greater than or equal to $1.0 \times 10^{16} [/cm^3]$ and less than or equal to $1.0 \times 10^{18} [/cm^3]$, for peak concentration. The doping concentration of the first low injection region 27 may be $1.5 \times 10^{17} [/cm^3]$, for peak concentration, for example. The doping concentration of the first low injection region 27 may be greater than or equal to $1.0 \times 10^{13} [/cm^2]$ and less than or equal to $1.0 \times 10^{15} [/cm^2]$, for the dose amount. The doping concentration of the first low injection region 27 may be $3.0 \times 10^{13} [/cm^2]$, for the dose amount, for example.

The doping concentration of the collector region 22 may be greater than or equal to 1.5 times and less than or equal to 2.5 times the doping concentration of the first low injection region 27, for both the peak concentration and the dose amount. The doping concentration of the collector region 22 is 2.0 times the doping concentration of the first low injection region 27, for both the peak concentration and the dose amount, for example.

In the present example, the end portion P1 is a negative Y-axis direction side end portion of the cathode region 82 arranged on the positive Y-axis direction side of the transistor portion 70. Furthermore, the end portion P1 is a positive Y-axis direction side end portion of the collector region 22 arranged farthest on the positive Y-axis direction side in the transistor portion 70. Furthermore, the end portion P1' is a positive Y-axis direction side end portion of the cathode region 82 arranged on the negative Y-axis direction side of the transistor portion 70. Furthermore, the end portion P1' is a negative Y-axis direction side end portion of the collector region 22 arranged farthest on the negative Y-axis direction side in the transistor portion 70.

In the present example, the end portion P2 is the positive Y-axis direction end portion of the first low injection region 27. Furthermore, the end portion P2 is the negative Y-axis direction side end portion of the collector region 22 arranged farthest on the positive Y-axis direction side in the transistor portion 70. The end portion P2' is the negative Y-axis direction end portion of the first low injection region 27. Furthermore, the end portion P2' is the positive Y-axis direction side end portion of the collector region 22 arranged farthest on the negative Y-axis direction side in the transistor portion 70.

In the present example, the collector region 22 arranged farthest on the positive Y-axis direction side in the transistor portion 70 may be provided in contact with the cathode region 82 on the positive Y-axis direction side in the end portion P1. The collector region 22 arranged farthest on the negative Y-axis direction side in the transistor portion 70 may be provided in contact with the cathode region 82 on the negative Y-axis direction side in the end portion P1'.

The first low injection region 27 and the collector region 22 that is arranged farthest on the positive Y-axis direction side in the transistor portion 70 may be provided in contact with each other at the end portion P2. The first low injection region 27 and the collector region 22 that is arranged farthest in the negative Y-axis direction in the transistor portion 70 may be provided in contact with each other at the end portion P2'.

The diode portion 80 is a region overlapping with the cathode region 82 in a direction perpendicular to the bottom surface 23. Furthermore, the transistor portion 70 is a region in which predetermined unit structures including the emitter region 12 and the contact region 15 are arranged regularly among the regions overlapping with the collector region 22 in the direction perpendicular to the bottom surface 23, except for in the boundary portion 71.

The interlayer dielectric film 38 is provided above the top surface 21, and also above the gate trench portion 40 and the dummy trench portion 30. The interlayer dielectric film 38 may be silicate glass such as PSG or BPSG. Alternatively, the interlayer dielectric film 38 may be an oxide film or a nitride film.

The top surface side lifetime control region 72 including the lifetime killer may be provided locally in the Z-axis direction in the drift region 18. As shown in FIG. 2B, the top surface side lifetime control region 72 may be provided continuously in the Y-axis direction, from the diode portion 80 to a portion of the transistor portion 70.

The top surface side lifetime control region 72 may be provided in the transistor portion 70 up to a region overlapping the gate trench portion 40 closest to the diode portion 80. In other words, the end portion KY of the top surface side lifetime control region 72 shown in FIG. 2B may be provided in the transistor portion 70 closer to the center of the transistor portion 70 in the Y-axis direction (farther in the negative Y-axis direction) than the gate trench portion 40 closest to the diode portion 80. Similarly, the end portion KY' of the top surface side lifetime control region 72 may be provided in the transistor portion 70 closer to the center of the transistor portion 70 in the Y-axis direction (farther in the positive Y-axis direction) than the gate trench portion 40 closest to the diode portion 80.

The top surface side lifetime control region 72 may be provided across the entire diode portion 80 in the Y-axis direction. In other words, the top surface side lifetime control region 72 may be provided across the entirety of a diode portion 80 in the Y-axis direction, from a portion of this diode portion 80 shown in FIG. 2B to a remaining portion of this diode portion 80 that is not shown in FIG. 2B.

The top surface side lifetime control region 72 may be provided to include the entirety of a diode portion 80 in the Y-axis direction. The top surface side lifetime control region 72 may be provided from a portion of the transistor portion 70 contacting the diode portion 80 negative Y-axis direction side to a portion of another transistor portion 70 contacting the diode portion 80 on the positive Y-axis direction side.

The top surface side lifetime control region 72 may be provided on the diode portions 80 arranged at respective Y-axis direction sides of the transistor portion 70. The top surface side lifetime control region 72 of each diode portion 80 may be provided to a portion of the transistor portion 70.

A bottom surface side lifetime control region 74 including a lifetime killer may be provided locally in the Z-axis direction in the buffer region 20. The bottom surface side lifetime control region 74 may be provided across the all of the transistor portion 70 and all of the diode portion 80 in the Y-axis direction.

The bottom surface side lifetime control region 74 is provided at a position in the depth direction of the semiconductor substrate 10 that is deeper than ½ of the thickness T of the semiconductor substrate 10 (i.e. deeper than the center of the semiconductor substrate 10 in the depth direction). When the bottom surface side lifetime control region 74 is provided at a position that is shallower in the depth direction of the semiconductor substrate 10 than ½ of the thickness T of the semiconductor substrate 10, it is easy for the leak current of the transistor portion 70 to increase. Therefore, the bottom surface side lifetime control region 74 is preferably provided at a position deeper in the depth direction of the semiconductor substrate 10 than ½ of the thickness T of the semiconductor substrate 10.

In the present example, the bottom surface side lifetime control region 74 is provided in the buffer region 20, but instead, the bottom surface side lifetime control region 74 may be provided in the drift region 18 if the position of the bottom surface side lifetime control region 74 is deeper in the depth direction of the semiconductor substrate 10 than ½ of the thickness T of the semiconductor substrate 10. Furthermore, the bottom surface side lifetime control region 74 does not need to be provided.

The top surface side lifetime control region 72 and the bottom surface side lifetime control region 74 have higher defect densities than other regions of the semiconductor substrate 10. One example of a lifetime killer is helium injected at a predetermined depth position. By injecting the semiconductor substrate 10 with helium ions with a predetermined acceleration energy, it is possible to form crystal defects that form trap levels such as vacancies and double vacancies inside the semiconductor substrate 10.

The bottom surface side lifetime control region 74 has a function of reducing the tail current when switching such as turning OFF or reverse recovery ends. By providing the bottom surface side lifetime control region 74, it is easy for holes that are minority carriers generated in the drift region 18 to recombine with electrons that are majority carriers with a short lifetime. Therefore, it is possible to reduce switching loss by reducing the tail current during switching, and to realize a favorable tradeoff between the ON voltage of the transistor portion 70 and the turn-OFF loss.

By providing the bottom surface side lifetime control region 74 across the diode portion 80 from the boundary portion 71, it is possible to restrict excessive injection of holes into the cathode region 82 of the diode portion 80 from the contact region 15 of the transistor portion 70 during operation of the diode portion 80. Therefore, it is possible to improve the reverse recovery characteristic of the diode portion 80.

In the present example, the width Wm is the mesa width of the first mesa portion 60. The mesa widths of the second mesa portion 62 and the third mesa portion 64 may be equal to the mesa width Wm.

In the present example, the width Wge is a trench pitch in the Y-axis direction. In other words, the width Wge is the width between a trench and another trench that is adjacent to this trench in the positive or negative Y-axis direction. The width between trenches is the distance between locations corresponding to two trenches. For example, the distance between center portions of respective trenches in the Y-axis direction may be used as the width between trenches. In the transistor portion 70 of the present example, the gate trench portions 40 and the dummy trench portions 30 are arranged in an alternating manner, one at a time, in the Y-axis direction. Therefore, the width Wge in the present example is the width in the Y-axis direction between a gate trench portion 40 and a dummy trench portion 30 that is adjacent to this gate trench portion 40 in the positive or negative Y-axis direction.

There are cases where a plurality of dummy trench portions 30 are provided sandwiched between two gate trench portions 40 in the transistor portion 70 or where one gate trench portion 40 is provided sandwiched between two dummy trench portions 30. In such cases, the width Wge may be the trench pitch between two adjacent gate trench portions 40 or the trench pitch between two adjacent dummy trench portions 30.

In the present example, the width Wgg is the trench pitch in the Y-axis direction between gate trench portions 40. In other words, the width Wgg is the width in the Y-axis direction between a gate trench portion 40 and another gate trench portion 40 that is closest to this gate trench portion 40 in the positive or negative Y-axis direction. Therefore, the width Wgg has a magnitude that differs according to the number of dummy trench portions 30 sandwiched between two gate trench portions 40. In the present embodiment, one dummy trench portion 30 is sandwiched between two gate trench portions 40, and therefore the width Wgg is equal to two times the width Wge.

The width Wge is 5 μm, for example. The width Wgg may be greater than or equal to 10 μm and less than or equal to 30 μm. The width Wgg is 20 μm, for example.

In the present example, the width Wk is the width in the Y-axis direction from the end portion P1 to the end portion KY of the top surface side lifetime control region 72. The width Wk' is the width in the Y-axis direction from the end portion P1' to the end portion KY' of the top surface side lifetime control region 72. The width Wk may be equal to the width Wk'. Furthermore, the width Wkk is the width in the Y-axis direction from the end portion KY to the end portion KY'.

In the present example, the width Winj is the width in the Y-axis direction of the first low injection region 27. In other words, the width Winj is the width in the Y-axis direction from the end portion P2 to the end portion P2'.

In the semiconductor device 100 of the present example, the width Winj may be greater than or equal to the width Wge and less than or equal to ⅓ of the width WI. In a case where one dummy trench portion 30 is sandwiched between two gate trench portions 40, by having the width Winj be greater than or equal to the width Wge, at least a portion of the first low injection region 27 in the Y-axis direction overlaps in the Z-axis direction with a portion of the gate trench portion 40.

If the end portion P2 is arranged at the center in the Y-axis direction of the first mesa portion 60 contacting the gate trench portion 40 on the positive Y-axis direction side, the end portion P2' is arranged in the center in the Y-axis direction of the first mesa portion 60 contacting this gate trench portion 40 on the negative Y-axis direction side.

In a case where a plurality of dummy trench portions 30 are sandwiched between two gate trench portions 40, by having the width Winj be greater than the width Wgg, at least a portion of the first low injection region 27 in the Y-axis direction overlaps in the Z-axis direction with the gate trench portion 40.

In the semiconductor device 100 of the present example, at least a portion of the first low injection region 27 in the Y-axis direction overlaps in the Z-axis direction with a portion of the gate trench portion 40. Furthermore, the carrier (holes in the present example) injection density of the first low injection region 27 from the bottom surface 23 side to the top surface 21 side is lower than the carrier injection density of the collector region 22. Therefore, it is possible to make the carrier concentration of the region overlapping with the first low injection region 27 lower than the carrier concentration of the region overlapping with the collector region 22. For example, in the base region 14, the accumulation region 16, and the drift region 18 near the accumulation region 16, it is possible to make the region where the first low injection region 27 is provided have a lower carrier concentration than the region where the collector region 22 is provided. When turned OFF, a spatial charge region expands from the pn junction of the base region 14 and the accumulation region 16 to the base region 14 and both sides of the accumulation region 16 and the drift region 18. At this time, the holes and electrons accumulated in these layers, particularly the holes, cause an increase in the electric field strength. By providing the first low injection region 27 near the center of the transistor portion 70, it is possible to lower the hole concentration in the region where the transistor portion 70 is provided. Therefore, it is possible to suppress the electric field concentration in the region where the first low injection region 27 is provided, and to restrict the occurrence of avalanche breakdown. Accordingly, it is possible to improve the withstand capability of the transistor portion 70, and to restrict damage of the transistor portion 70 that can occur when the carrier avalanche is high.

The width Winj is preferably less than or equal to ⅓ of the width WI. If the width Winj is large, it is easy for snapback to occur in the current-voltage waveform when the transistor portion 70 is turned ON. The first low injection region 27 preferably has a large range in which snapback does not occur. Furthermore, the larger the width Winj of the first low injection region 27, the greater the ON voltage of the transistor portion 70, and therefore the width Winj is preferably less than or equal to ⅓ of the width WI.

The width Winj may be greater than or equal to the thickness T of the semiconductor substrate 10 and less than or equal to ⅓ of the width WI. Alternatively, the width Winj may be greater than the width Wge and less than or equal to the width T.

The width Winj may be greater than or equal to ¹⁄₁₀ of the width WI and less than or equal to ⅓ of the width WI. Alternatively, the width Winj may be greater than or equal to the width Wge and less than or equal to ¹⁄₁₀ of the width WI. Here, ¹⁄₁₀ of the width WI may be greater than or less than the thickness T.

The first low injection region 27 does not need to overlap with the top surface side lifetime control region 72, in the top view of the semiconductor substrate 10. In other words, the end portion KY may be arranged on the positive Y-axis direction side of the end portion P2, and the end portion KY' may be arranged on the negative Y-axis direction side of the end portion P2'. The width Wkk may be greater than the width Winj. The top surface side lifetime control region 72 has a function of restricting holes from arriving on the top surface side, and also has a function of restricting the first low injection region 27 from injecting holes to the drift region 18. Therefore, if these two layers overlap in the top view, there is excessive restriction of hole injection from the collector region 22. Accordingly, by preventing these two layers from overlapping in the top view, it is possible to restrict an increase in the ON voltage, without excessively restricting the hole injection from the collector region 22.

The width Wk and the width Wk' may be greater than or equal to 50 μm and less than or equal to 250 μm. The width Wj and the width Wk' are each 150 μm, for example. The width Wkk may be greater than or equal to 1000 μm and less than or equal to 1400 μm. The width Wkk is 1200 μm, for example.

Figure 3A:
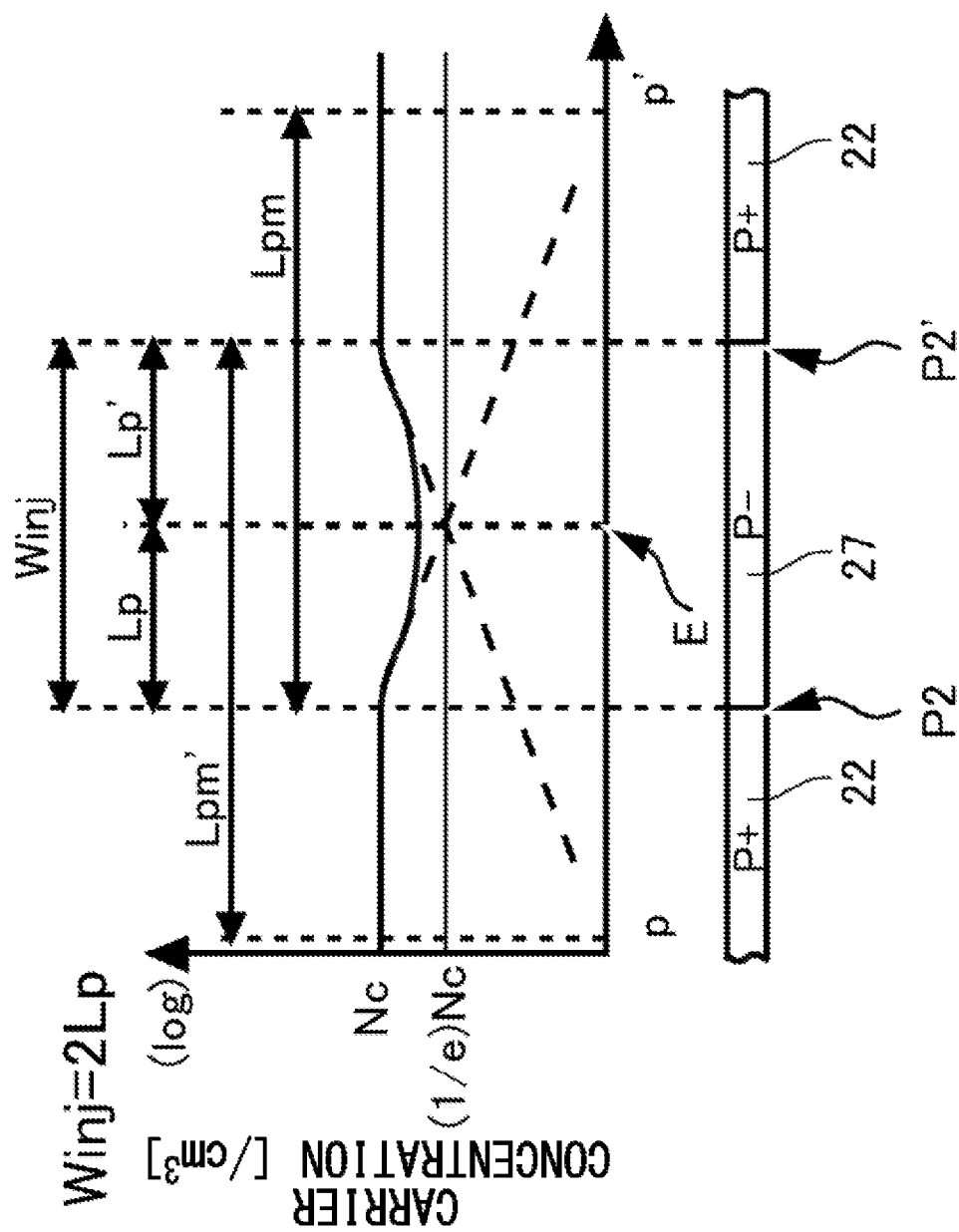
FIG. 3A is a diagram for describing the relationship between the width Winj and the carrier diffusion length Lp.
Figure 3B:
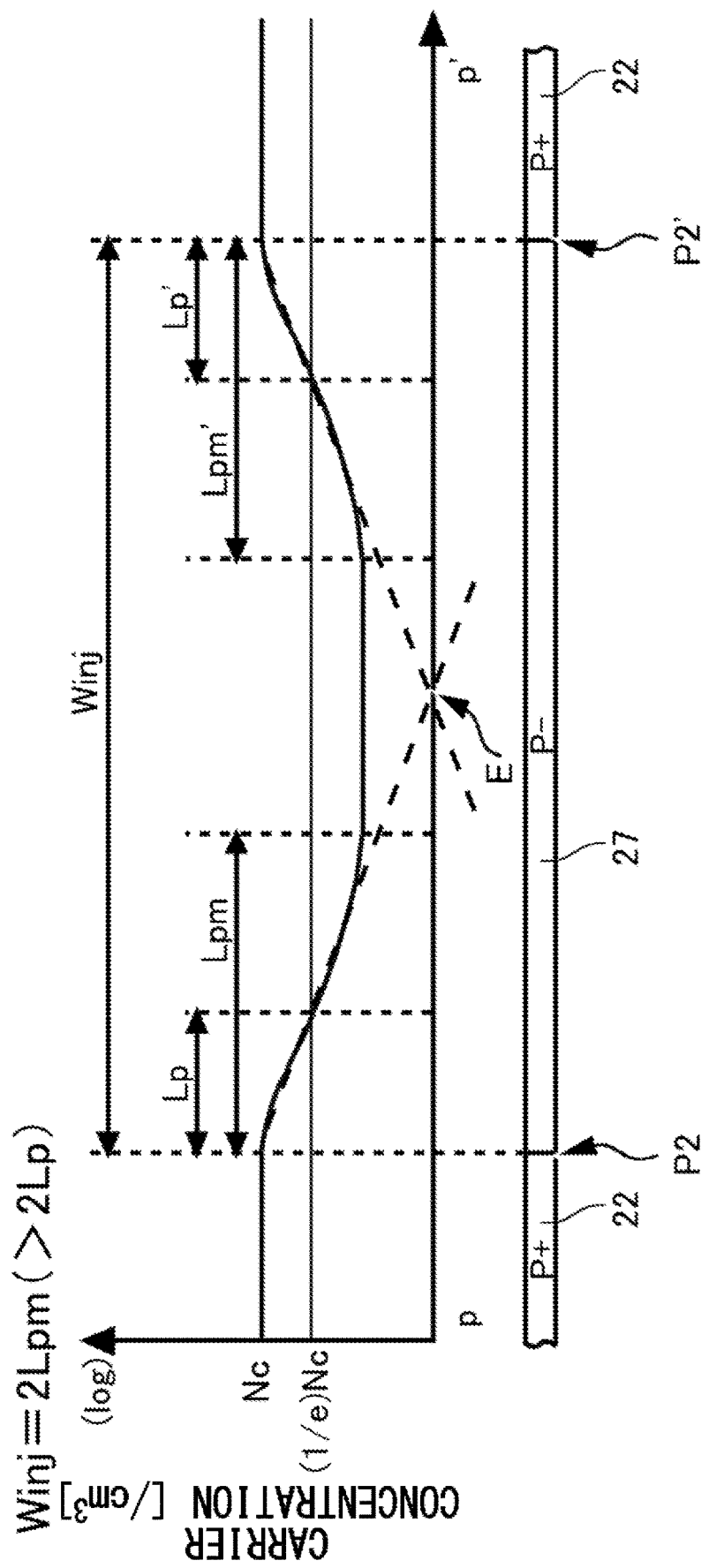
FIG. 3B is a diagram for describing the relationship between the width Winj and the carrier diffusion length Lp.
Figure 3C:
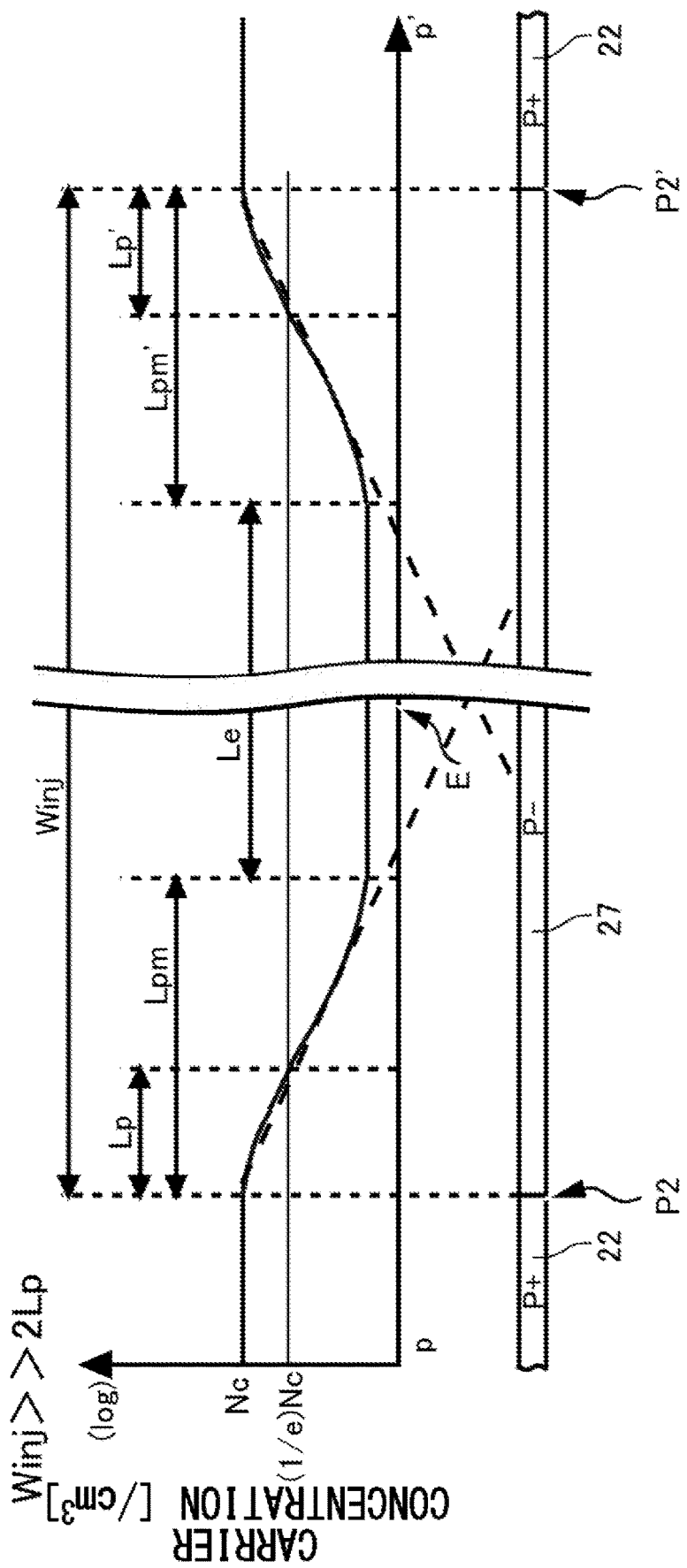
FIG. 3C is a diagram for describing the relationship between the width Winj and the carrier diffusion length Lp.

FIG. 3A, FIG. 3B, and FIG. 3C are diagrams for describing the relationship between the width Winj and the carrier diffusion length Lp, along the p-p line of FIG. 2B. The horizontal axis represents the position in the p-p cross section. The vertical axis represents the carrier concentration, in a common logarithmic representation. In FIGS. 3A to 3C, for the sake of convenience, the positive and negative directions on the Y axis are switched from the directions in FIG. 2A and FIG. 2B. In the present example, the doping concentration of the first low injection region 27 is lower than the doping concentration of the collector region 22, and therefore carrier diffusion occurs in the Y-axis direction from the collector region 22 to the first low injection region 27. The carrier diffusion to the first low injection region 27 occurs from the collector regions 22 sandwiching the first low injection region 27 in the Y-axis direction.

The carrier concentration at the end portion P2 and the end portion P2' is Nc. In FIGS. 3A to 3C, the length Lpm is the distance from the end portion P2 to the point at which the carrier concentration reaches 1% of the concentration Nc. The length Lpm' is the distance from the end portion P2' to the point at which the carrier concentration reaches 1% of the concentration $N_C$. The length Lpm and the length Lpm' may be equal. Furthermore, the carrier diffusion length Lp is the diffusion length from the end portion P2. The carrier diffusion length Lp' is the diffusion length from the end portion P2'. The carrier diffusion length Lp and the carrier diffusion length Lp' may be equal. The carrier diffusion length is calculated for the holes and for the electrons, as the square root $((D\tau)^{\wedge}0.5)$ of a value obtained by multiplying a diffusion coefficient D by the lifetime τ. Since the Y-axis direction is orthogonal to the X-axis direction that is the conduction direction, the carrier diffusion length in the Y-axis direction is less than the calculated value and the carrier diffusion length in the X-axis direction.

FIG. 3A shows a case in which Winj=2Lp. FIG. 3A shows a carrier concentration distribution in the Y-axis direction with a shape dropping into a depression in a curved manner at the center E in the Y-axis direction of the first low injection region 27, i.e. at the center portion of the first low injection region 27. FIG. 3B shows a case in which Winj=2Lpm (>2Lp). In FIG. 3B, the carrier concentration distribution in the Y-axis direction is approximately flat, in the same manner as in the collector region 22. The region where the carrier concentration distribution is flat is a region where the carrier concentration is determined by the doping concentration of the first low injection region 27. FIG. 3C shows a case where Winj>>2Lp, i.e. a case where the width Winj is significantly greater than double the carrier diffusion length Lp. In FIG. 3C, a flat carrier concentration region, which is determined by the doping concentration of the first low injection region 27, occurs across a length Le centered on the center E of the first low injection region 27 in the Y-axis direction. In this case, it is possible for a situation to occur in which the carrier concentration drops more than necessary and the ON voltage increases. Due to the above, the width Winj is preferably less than or equal to double the carrier diffusion length Lp.

Figure 4A:
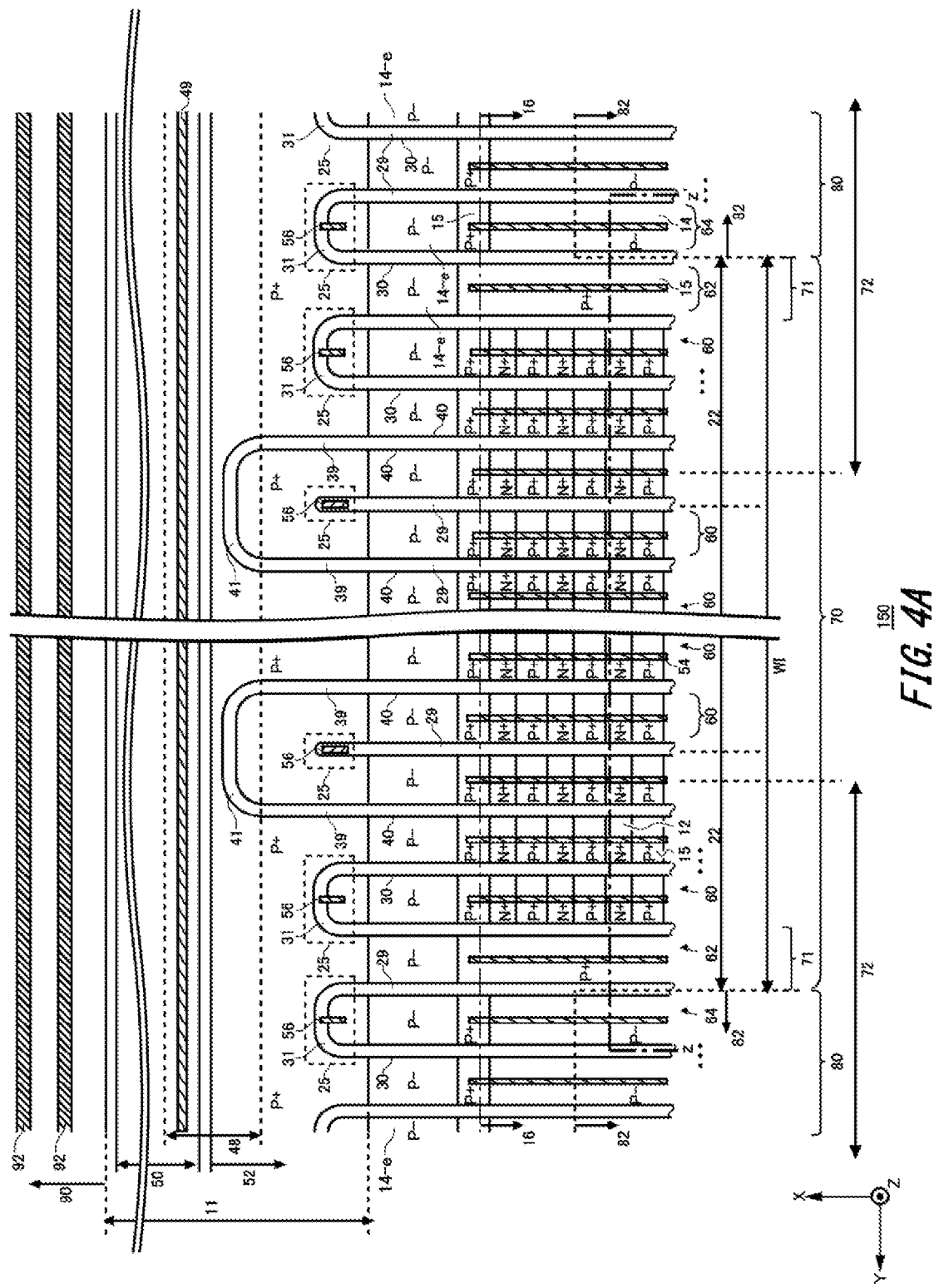
FIG. 4A shows a portion of the top surface of a semiconductor device 150 according to a comparative example.

FIG. 4A shows a portion of the top surface of a semiconductor device 150 according to a comparative example. FIG. 4A shows a portion of the comparative example corresponding to region A shown in FIG. 2A. As shown in FIG. 4A, the semiconductor device 150 of the comparative example differs from the semiconductor device 100 shown in FIG. 2A by not including the first low injection region 27.

Figure 4B:
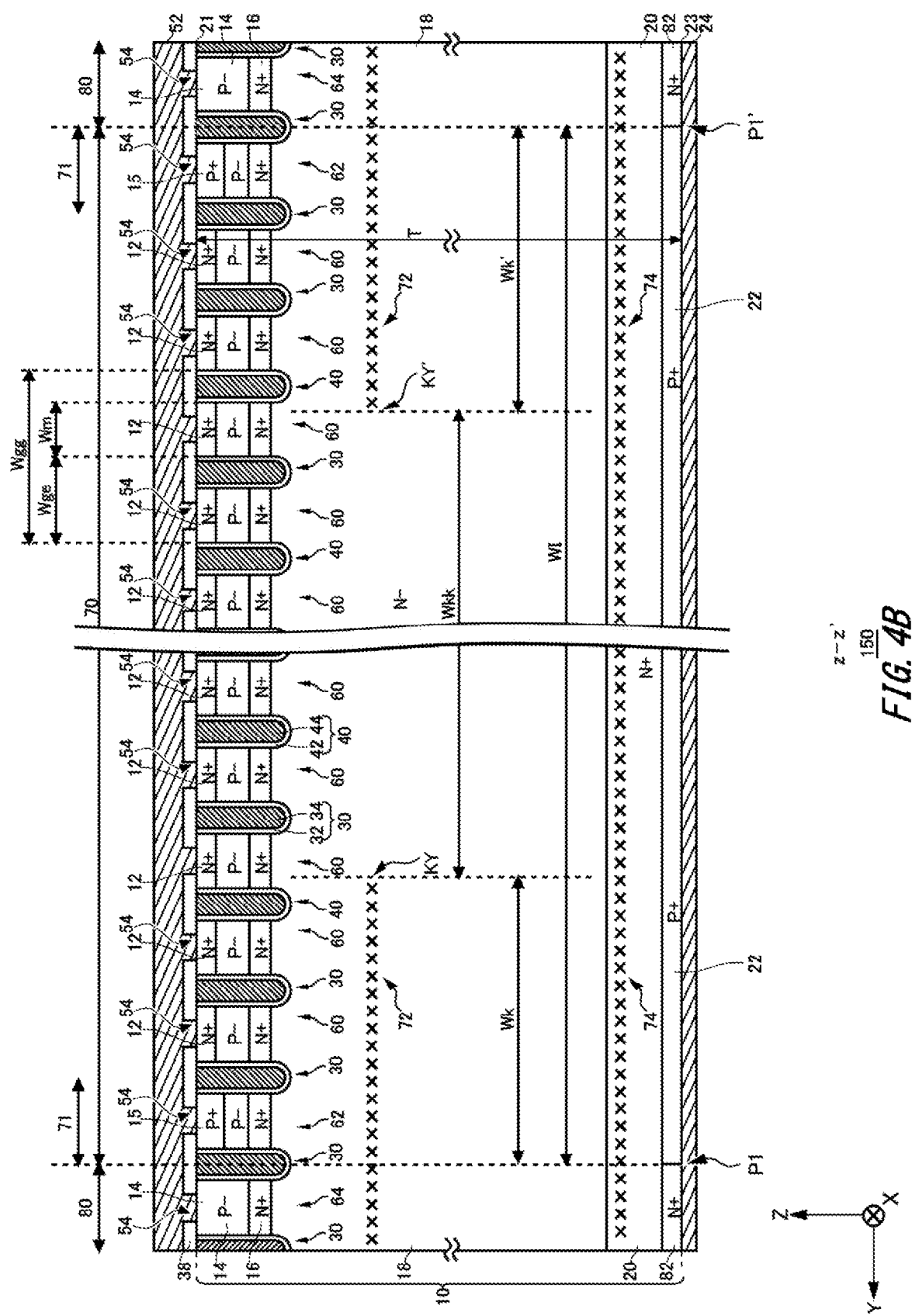
FIG. 4B shows the cross section along the line z-z' of FIG. 4A.

FIG. 4B shows the cross section along the line z-z' of FIG. 4A. As shown in FIG. 4B, the semiconductor device 150 of the comparative example does not include the first low injection region 27 in the bottom surface 23 of the transistor portion 70. In the semiconductor device 150 of the comparative example, the collector region 22 is provided continuously in the Y-axis direction from the end portion P1 to the end portion P1', in the bottom surface 23 of the transistor portion 70.

Figure 5A:
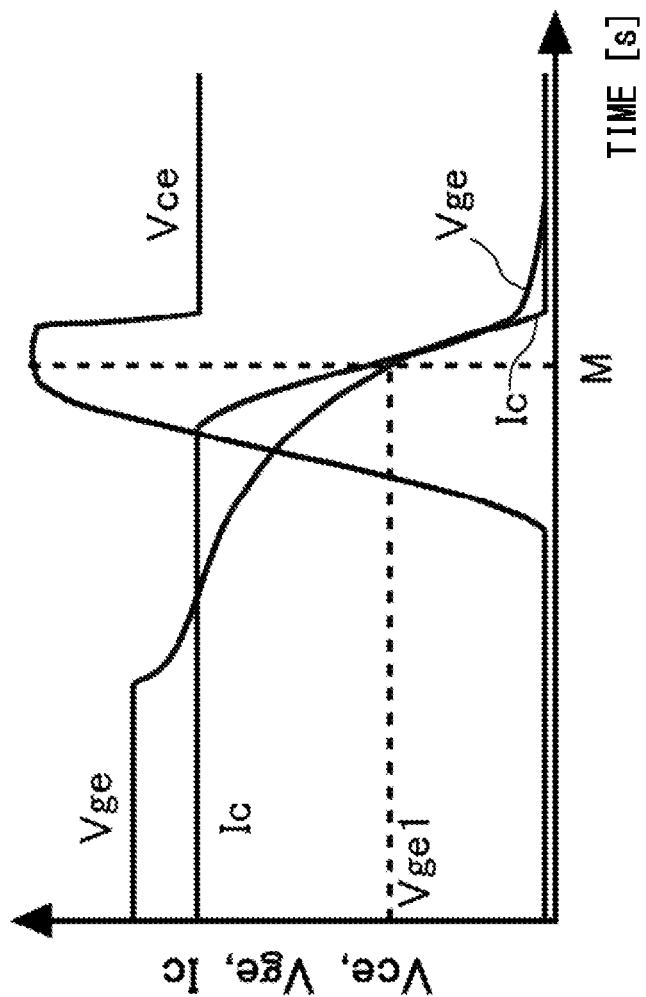
FIG. 5A shows the changes in the voltage Vge and the current Ic when the voltage Vce is changed, for each gate resistance Rg.
Figure 5B:
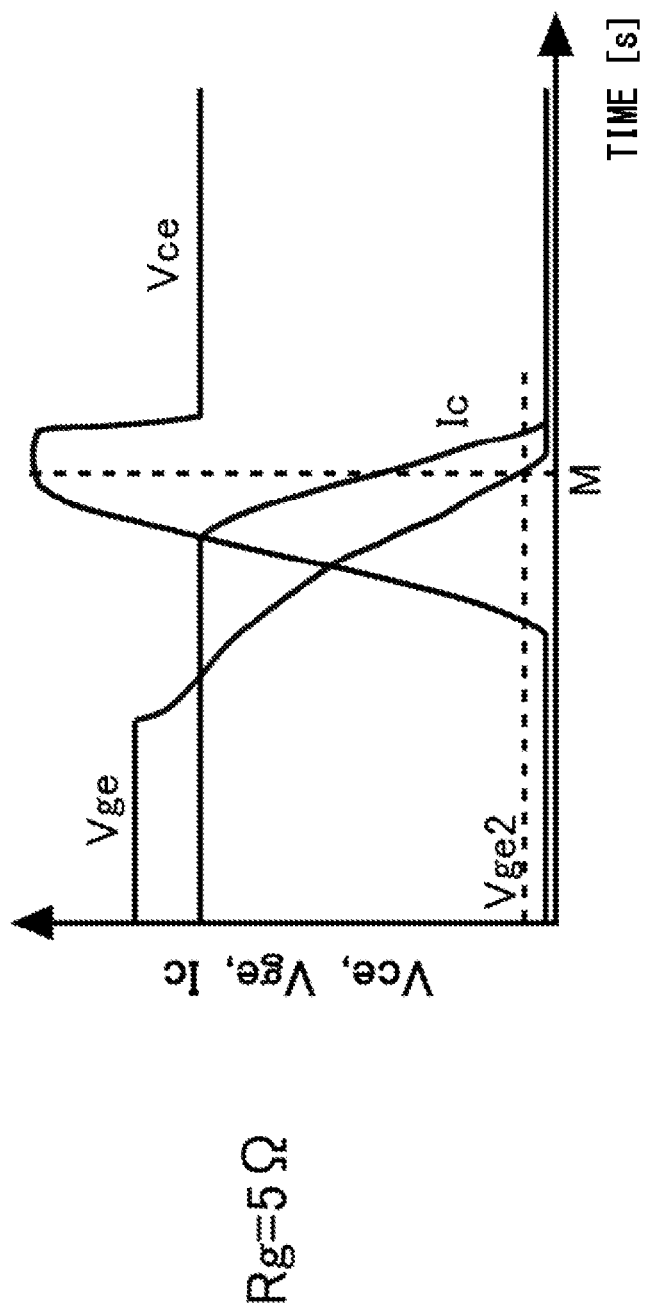
FIG. 5B shows the changes in the voltage Vge and the current Ic when the voltage Vce is changed, for each gate resistance Rg.
Figure 5C:
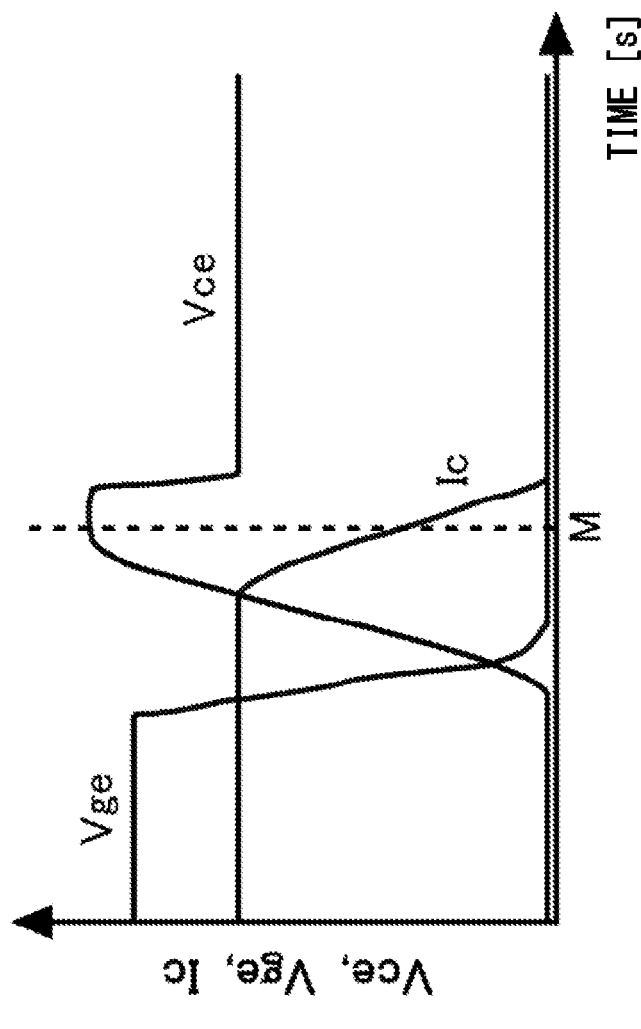
FIG. 5C shows the changes in the voltage Vge and the current Ic when the voltage Vce is changed, for each gate resistance Rg.

FIGS. 5A, 5B, and 5C show the change in the current Ic flowing into the collector electrode 24 and the voltage Vge between the gate metal layer 50 and the emitter electrode 52 for each gate resistance Rg, when the voltage Vce between the emitter electrode 52 and the collector electrode 24 is changed, in the transistor portion 70. FIG. 5A shows a case in which Rg=10Ω, FIG. 5B shows a case in which Rg=5Ω, and FIG. 5C shows a case in which Rg=1Ω. In FIGS. 5A to 5C, the time M is the time at which Vce is the maximum. The results of the present example were obtained in an environment where the temperature was 150° C.

In the case where Rg=10Ω shown in FIG. 5A, the voltage Vge exhibits a non-zero value Vge1. This shows that the channel caused by the electron inversion layer formed in the front surface of the interface contacting the gate trench portion 40 is open at the time M. When the channel is open, the transistor portion 70 switches in a state where the electron current is supplied to the collector region 22 from the emitter region 12 in a high-voltage state. Therefore, a hole current flows from the collector region 22 to the emitter region 12, in response to this electron current. When the hole current flows from the collector region 22 to the emitter region 12, the current is diffused inside the semiconductor chip, and therefore it is difficult for localized impact ionization to occur. Therefore, it is difficult for the hole avalanche caused by impact ionization to occur, and it is difficult for the transistor portion 70 to break down.

In the case where Rg=5Ω shown in FIG. 5B, the voltage Vge exhibits a non-zero value Vge2 at the time M. Therefore, due to a similar effect as in the case of FIG. 5A, it is difficult for a breakdown to occur in the transistor portion 70, but since the voltage Vge2 is less than the voltage Vge1, it is easier for a breakdown to occur in the transistor portion 70 compared to the case of FIG. 5A.

In the case where Rg=1Ω shown in FIG. 5C, the voltage Vge is zero. This shows that the channel is closed at the time M. When the channel is closed, the transistor portion 70 switches in a state where the electron current is not supplied from the emitter region 12 to the collector region 22 in a high-voltage state. Therefore, in the high-voltage state, the transistor portion 70 causes a large current that is only a hole current to flow from the collector region 22 to the emitter region 12. Accordingly, it is easy for holes to be accumulated in the first mesa portion 60 and current is not diffused within the semiconductor chip, and therefore it is easy for localized impact ionization to occur. Therefore, it is easy for a hole avalanche to occur due to the impact ionization, and it is easy for an avalanche to occur in the transistor portion 70.

The semiconductor device 150 of the comparative example includes the collector region 22 provided in the bottom surface 23 of the transistor portion 70, but does not includes the first low injection region 27. Therefore, when the gate resistance Rg is small, it is easy for an avalanche to occur in the transistor portion 70 in the region where the turn-OFF is fast, due to the effect described in the case of FIG. 5C.

As shown in FIGS. 1 to 2B, the semiconductor device 100 of the present example includes the first low injection region 27 in the bottom surface 23 of the transistor portion 70, and therefore even when the gate resistance Rg is small, it is possible to restrict the accumulation of holes in the first mesa portion 60. Therefore, it is difficult for a hole avalanche caused by localized impact ionization to occur, and it is difficult for the transistor portion 70 to break down even in regions where the turn-OFF is fast.

Figure 6A:
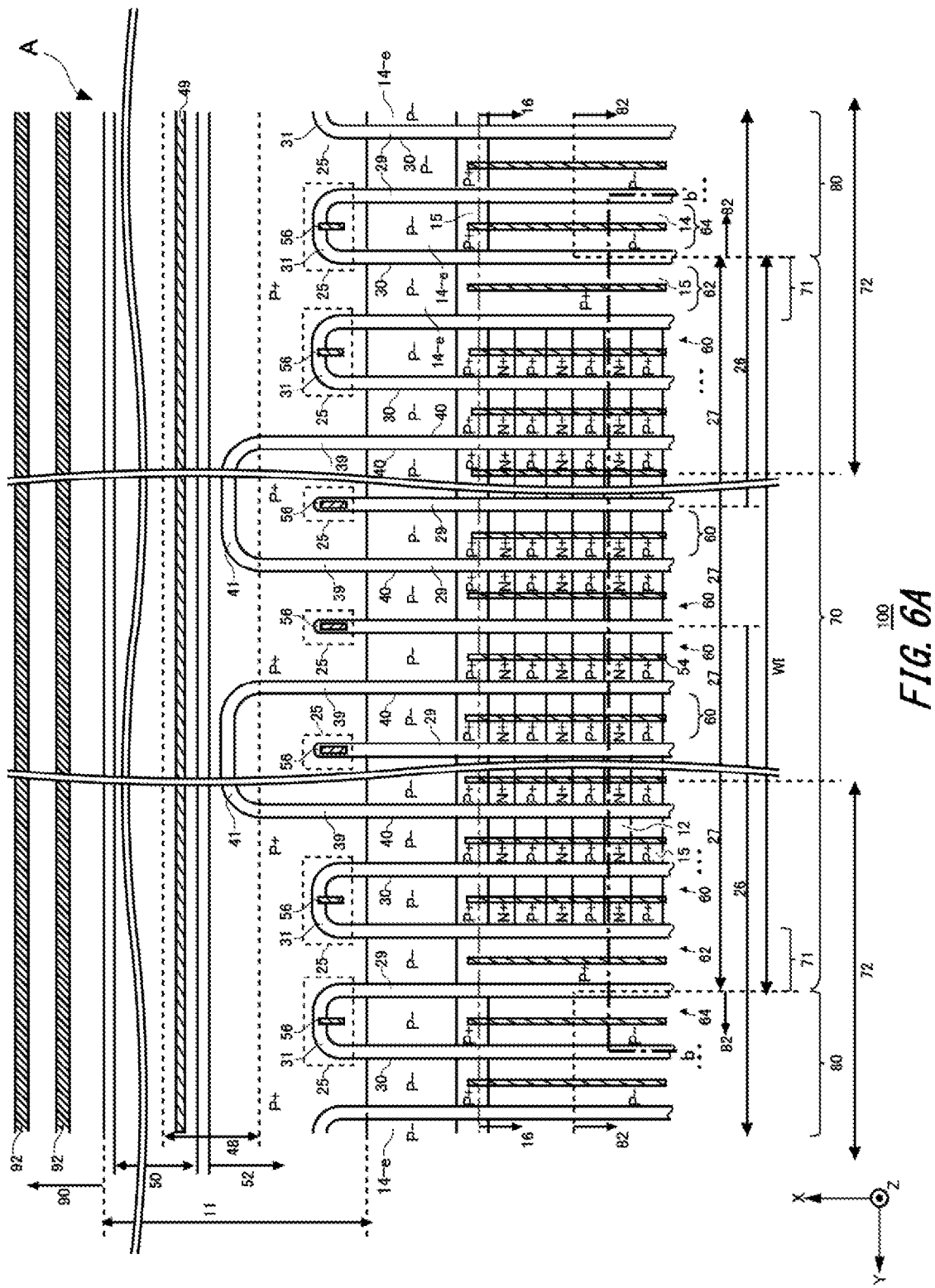
FIG. 6A is an enlarged view of another example of the region A in FIG. 1.

FIG. 6A is an enlarged view of another example of the region A in FIG. 1. The semiconductor device 100 shown in FIG. 6A differs from the semiconductor device 100 shown in FIG. 2A in that the first low injection region 27 is provided sandwiched between cathode regions 82 provided at respective ends in the Y-axis direction. Furthermore, the semiconductor device 100 shown in FIG. 6A differs from the semiconductor device 100 shown in FIG. 2A in that a second injection region 26 having the second conductivity type is provided at both Y-axis direction ends of the transistor portion 70, and the second injection region 26 extends to the diode portion 80 in the Y-axis direction. The second injection region 26 of the present example is P⁻ type, for example.

Figure 6B:
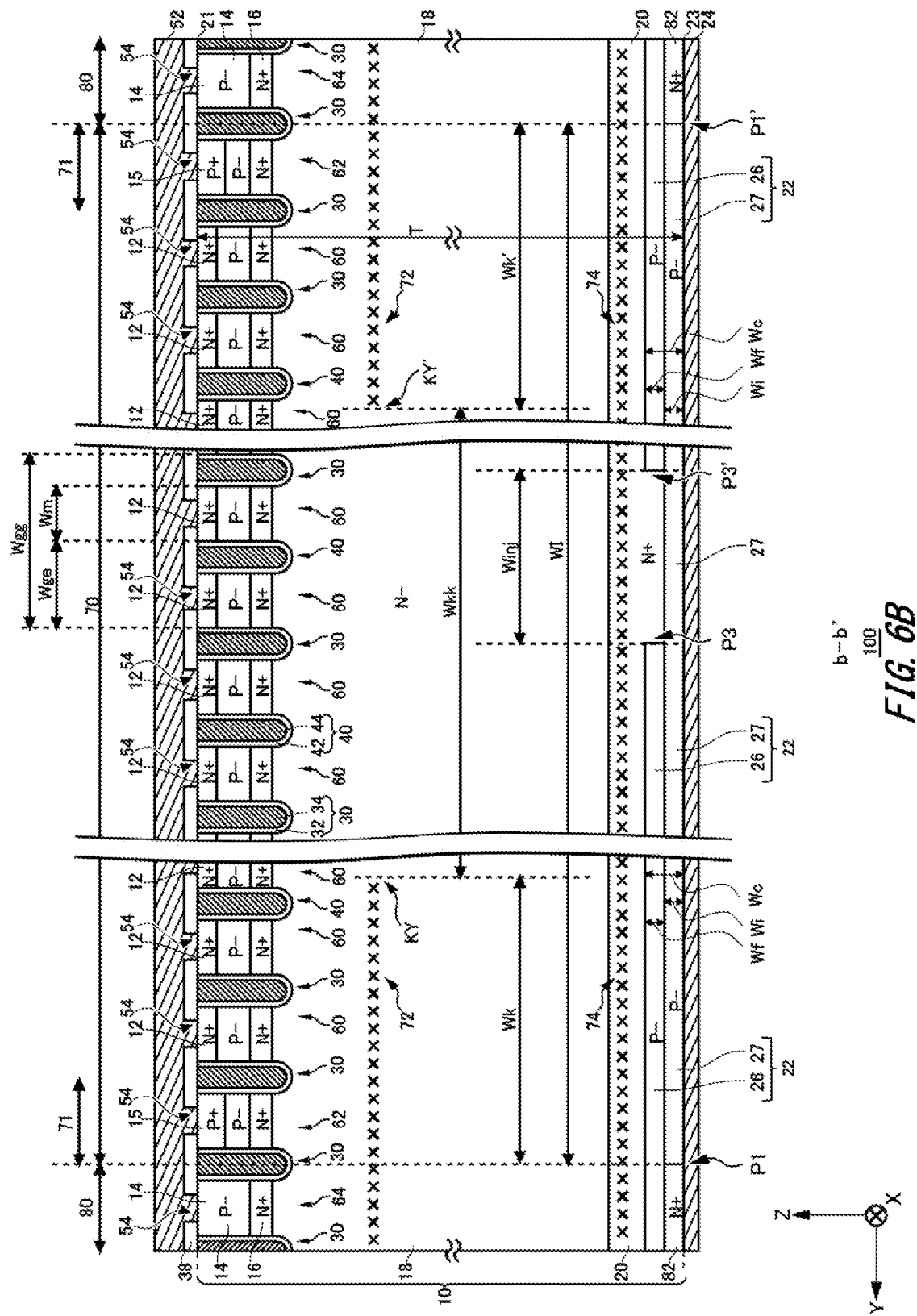
FIG. 6B shows an example of the cross section along the line b-b' in FIG. 6A.

FIG. 6B is a diagram showing the cross section along the line b-b' in FIG. 6A. As shown in FIG. 6B, the semiconductor device 100 of the present example includes the first low injection region 27 in the bottom surface 23 of the transistor portion 70. In the present example, the first low injection region 27 is provided continuously in the Y-axis direction, from the end portion P1 to the end portion P1'.

The semiconductor device 100 of the present example includes the second injection region 26 above a portion of the first low injection region 27 and above the cathode region 82. The second injection region 26 may be provided in contact with the first low injection region 27 and the cathode region 82. In the present example, the second injection region 26 is provided in the buffer region 20, but the second injection region 26 may be provided in the drift region 18 instead.

The doping concentration of the second injection region 26 may be equal to the doping concentration of the first low injection region 27, for both the peak concentration and the dose amount. The doping concentration and the dose amount correspond to the integrated value of the doping concentration in the depth direction. The sum of the doping concentration of the second injection region 26 and the doping concentration of the first low injection region 27 may be equal to the doping concentration of the collector region 22 in the example if FIG. 2B.

In the present example, the width Wf is the width of the second injection region 26 in the Z-axis direction. The width Wi is the width of the first low injection region 27 in the Z-axis direction. The width Wc is the combined widths of the second injection region 26 and the first low injection region 27, i.e. the sum of the width Wf and the width Wi, in the Z-axis direction. The width Wf may be equal to the width Wi. If the width Wf and the width Wi are equal, the width Wc is double the width Wf and also double the width Wc.

The region where the second injection region 26 and the first low injection region 27 overlap in the top view of the semiconductor substrate 10 is the collector region 22. The region where the first low injection region 27 is provided but the second injection region 26 is not provided corresponds to the first low injection region 27 of FIG. 2A. In the present example, the integrated concentration obtained by integrating the doping concentration of the first low injection region 27 in the Z-axis direction is lower than the integrated concentration obtained by integrating the doping concentration of the collector region 22 in the Z-axis direction. The doping concentrations of the first low injection region 27 and the second injection region 26 may each have a peak in the Z-axis direction, or may each be uniform in the Z-axis direction.

In the present example, the width Wi is less than the width We of the collector region 22. In other words, in the present example, by making the Z-axis direction width of the first low injection region 27 less than the X-axis direction width of the collector region 22, the carrier injection density of the first low injection region 27 from the bottom surface to the top surface side of the semiconductor substrate 10 becomes lower than the carrier injection density of the collector region 22.

In the present embodiment, the end portion P3 is the negative Y-axis direction side end portion of the second injection region 26 arranged farthest on the positive Y-axis direction side in the transistor portion 70. The end portion P3' is the positive Y-axis direction side end portion of the second injection region 26 arranged farthest on the negative Y-axis direction side in the transistor portion 70. The position of the end portion P3 in the Y-axis direction may be the same as the position of the end portion P2 in the example shown in FIG. 2B. The position of the end portion P3' in the Y-axis direction may be the same as the position of the end portion P2' in the example shown in FIG. 2B.

The semiconductor device 100 of the present example includes the first low injection region 27 farther inward than the collector regions 22 provided at respective Y-axis direction ends of the transistor portion 70. The collector regions 22 and the first low injection region 27 are provided in the bottom surface 23. Furthermore, the carrier injection density of the first low injection region 27 from the bottom surface 23 to the top surface 21 is lower than the carrier injection density of the collector region 22. Therefore, in the same manner as in the semiconductor device 100 shown in FIG. 2B, even when the gate resistance Rg is small and the transistor portion 70 switches in a state where the channel caused by the electron inversion layer is closed, it is possible to restrict the accumulation of holes on the top surface 21 side of the first mesa portion 60. Therefore, it is possible to improve the withstand capability of the transistor portion 70, and to restrict breakdown of the transistor portion 70 that can occur when the carrier avalanche is high.

Figure 7A:
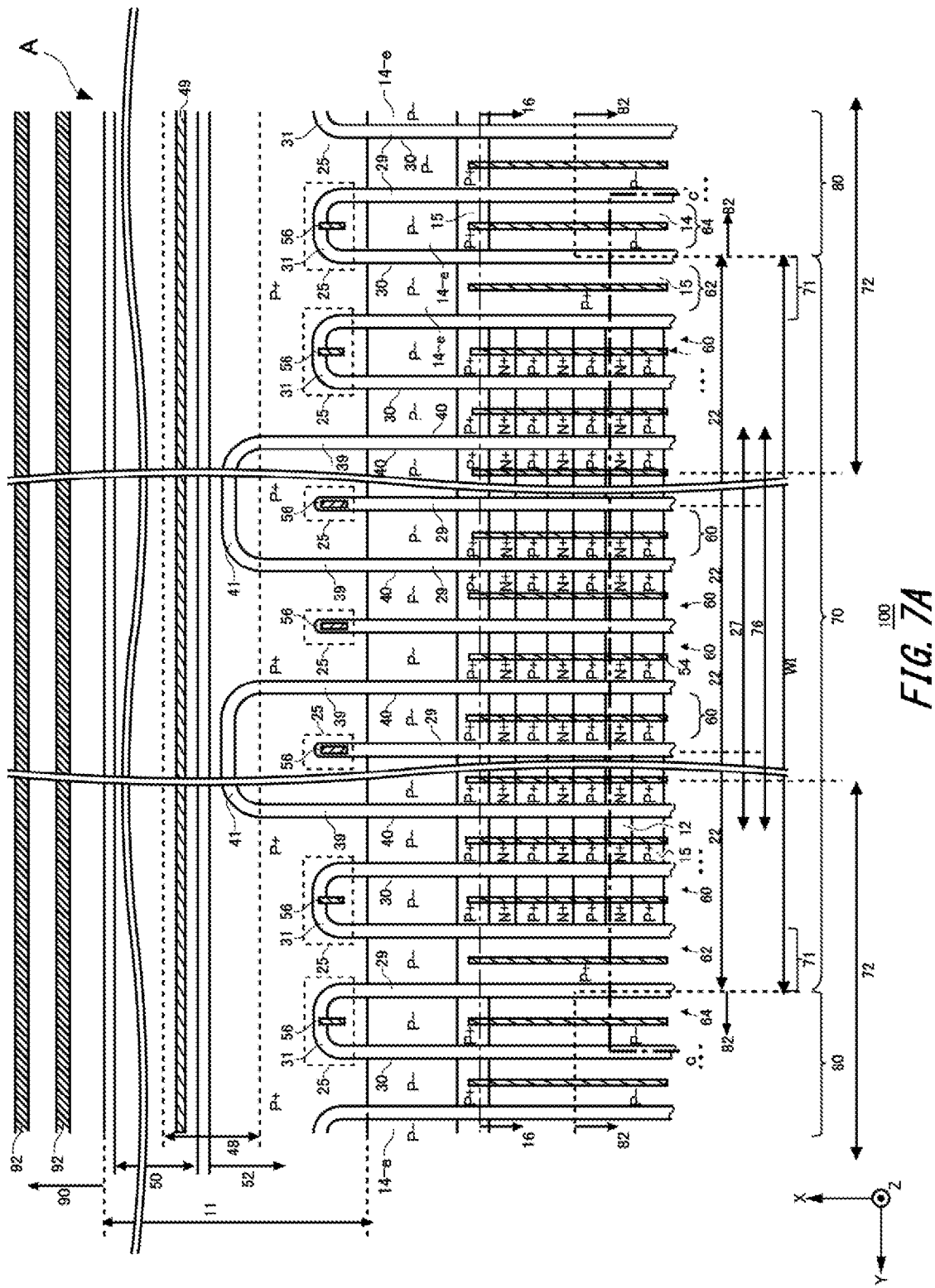
FIG. 7A is an enlarged view of another example of the region A in FIG. 1.

FIG. 7A is an enlarged view of another example of the region A in FIG. 1. The semiconductor device 100 shown in FIG. 7A differs from the semiconductor device 100 shown in FIG. 2A in that the collector region 22 is provided continuously in the Y-axis direction and sandwiched between cathode regions 82 provided at respective ends in the Y-axis direction. Furthermore, the semiconductor device 100 shown in FIG. 7A differs from the semiconductor device 100 shown in FIG. 2A in that a lifetime control region 76 including a lifetime killer is provided inside the semiconductor substrate 10.

Figure 7B:
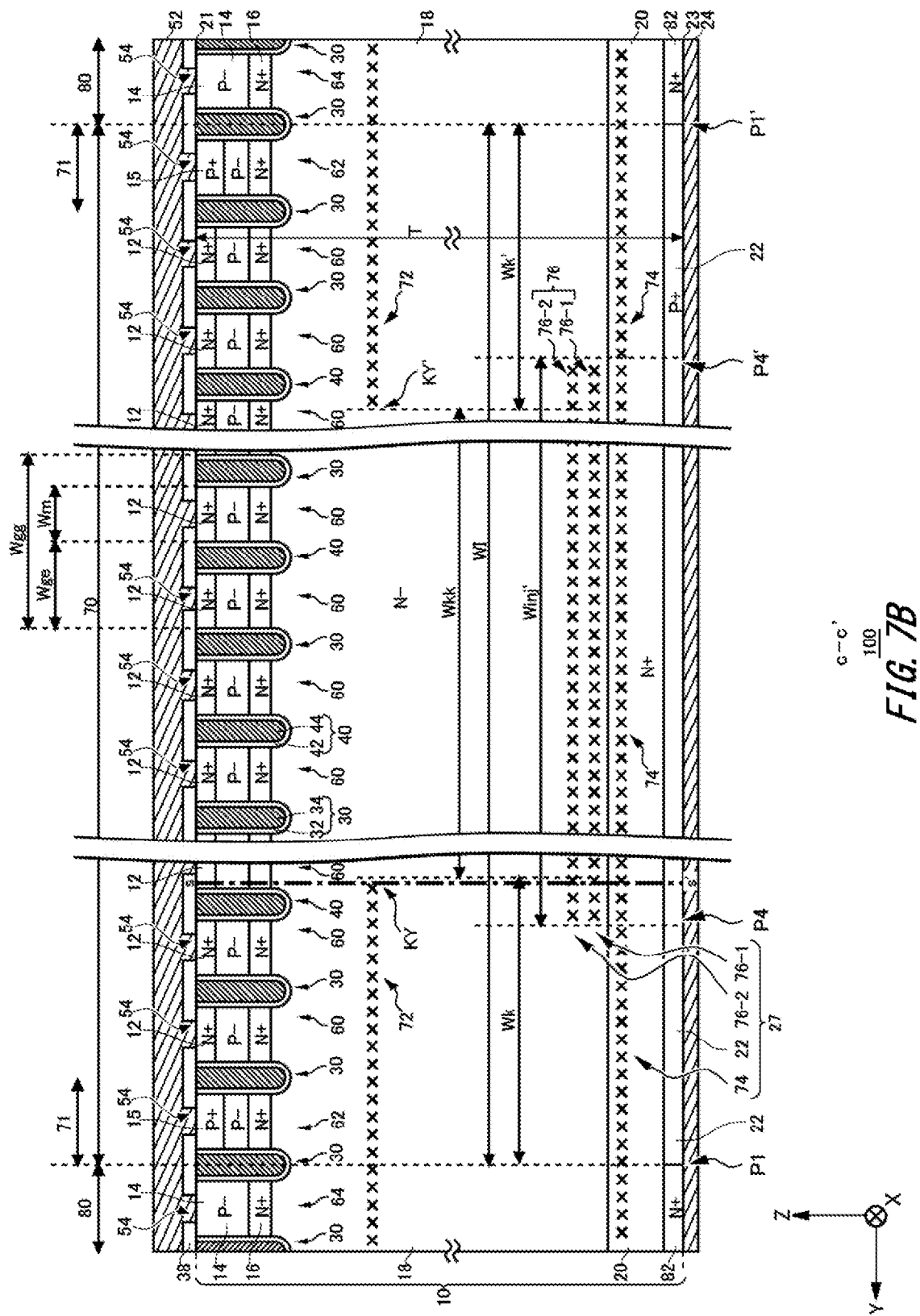
FIG. 7B shows an example of the cross section along the line c-c' in FIG. 7A.

FIG. 7B shows an example of the cross section along the line c-c' in FIG. 7A. As shown in FIG. 7B, in the semiconductor device 100 of the present example, the collector region 22 is provided continuously in the Y-axis direction from the end portion P1 to the end portion P1'. The collector region 22 is provided in the bottom surface 23 of the transistor portion 70. Furthermore, the lifetime control region 76 is provided extending in the Y-axis direction in a bottom portion of the drift region 18. The bottom portion of the drift region 18 may be a portion of the drift region 18 that is on the bottom side of the center in the thickness direction of the semiconductor substrate 10.

In the present example, the lifetime control region 76 is formed by two lifetime control regions, specifically a lifetime control region 76-1 and a lifetime control region 76-2. The lifetime control region 76 may include two or more lifetime control regions, or may include one lifetime control region.

In the present example, the end portion P4 is the positive Y-axis direction end portion of the lifetime control region 76. The end portion P4' is the negative Y-axis direction end portion of the lifetime control region 76. The end portion P4 may be arranged farther on the positive Y-axis direction side than the end portion KY. The end portion P4' may be arranged farther on the negative Y-axis direction side than the end portion KY'.

In the present example, the first low injection region 27 includes the lifetime control region 76 provided on the bottom surface 23 side. The lifetime control region 76 includes a lifetime killer. In the present embodiment, the lifetime control region 76, the bottom surface side lifetime control region 74, and the collector region 22 may collectively form the first low injection region 27, in the region from the end portion P4 to the end portion P4' in the Y-axis direction. In the present example, the width Winj of the first low injection region 27 in the Y-axis direction may be greater than the width Winj in the examples shown in FIGS. 2B and 6B.

In the semiconductor device 100 of the present example, the lifetime control region 76 is provided above the collector region 22. The lifetime of the carriers injected from the collector region 22 is reduced by the lifetime control region 76. Therefore, in the region where the lifetime control region 76 is provided, the carrier (holes in the present example) injection density from the bottom surface 23 side to the top surface 21 side is reduced more than in the region where the lifetime control region 76 is not provided. In the present example, the region on the positive Y-axis direction side of the end portion P4 and the region on the negative Y-axis direction side of the end portion P4' are regions where the lifetime control region 76 is not provided.

FIG. 7C shows the vacancy and divacancy concentration distribution of the top surface side lifetime control region 72, the bottom surface side lifetime control region 74, and the lifetime control region 76 in the s-s' cross section of FIG. 7B. By providing the lifetime control region 76 in addition to the bottom surface side lifetime control region 74 above the collector region 22, the carrier (holes in the present example) injection density from the bottom surface 23 side to the top surface 21 side is reduced. Therefore, in the same manner as in the semiconductor devices 100 shown in FIG. 2B and FIG. 6B, even when the gate resistance Rg is small and the transistor portion 70 switches in a state where the channel caused by the electron inversion layer is closed, it is possible to restrict the accumulation of holes in the top surface 21 side of the first mesa portion 60. Therefore, it is possible to improve the withstand capability of the transistor portion 70, and to restrict damage of the transistor portion 70 that can occur when the carrier avalanche is high.

The top surface side lifetime control region 72 may be formed by injecting helium ions from the top surface 21 with a predetermined acceleration energy. The bottom surface side lifetime control region 74 and the lifetime control region 76 may be formed by injecting helium ions from the bottom surface 23. By injecting helium, crystal defects can be formed inside the semiconductor substrate 10. The crystal defects may be defects that become carrier recombination centers, and may be mostly vacancies (V) and double vacancies (VV).

The vacancy and divacancy concentration of the lifetime control region 76 may be lower than the vacancy and divacancy concentration of the bottom surface side lifetime control region 74. The vacancy and divacancy concentration of the lifetime control region 76 may be lower than the vacancy and divacancy concentration of the top surface side lifetime control region 72.

Figure 8A:
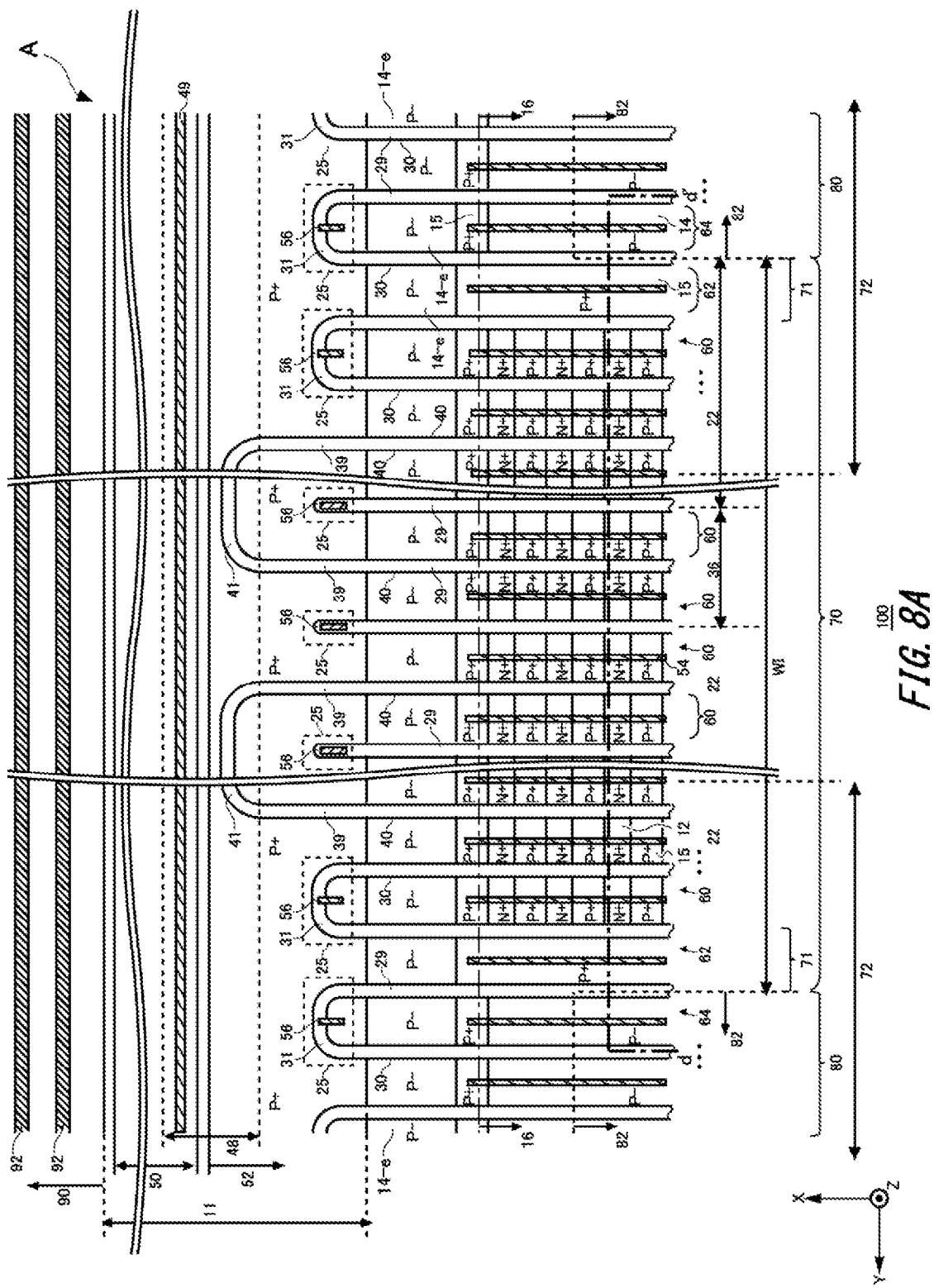
FIG. 8A an enlarged view of another example of the region A in FIG. 1.

FIG. 8A is an enlarged view of another example of the region A in FIG. 1. The semiconductor device 100 shown in FIG. 8A differs from the semiconductor device 100 shown in FIG. 2A in that at least a portion of the first low injection region 27 includes an injection inhibition region 36 with a conductivity type that is opposite the conductivity type of the collector region 22. Having at least a portion of the first low injection region 27 include the injection inhibition region 36 may also include a case in which the entirety of the first low injection region 27 includes the injection inhibition region 36, i.e. a case where the first low injection region 27 is provided with the injection inhibition region 36 instead of the P⁻ type first low injection region 27. The present example is an example in which the injection inhibition region 36 is provided in the semiconductor device 100 shown in FIG. 2A instead of the P⁻ type first low injection region 27.

The doping concentration of the injection inhibition region 36 may be equal to the doping concentration of the cathode region 82. The doping concentration of the injection inhibition region 36 may be equal to the doping concentration of the buffer region 20. The doping concentration of the injection inhibition region 36 may be N type and equal to the doping concentration of the drift region 18. The injection inhibition region 36 of the present example is N⁺ type, as an example.

Figure 8B:
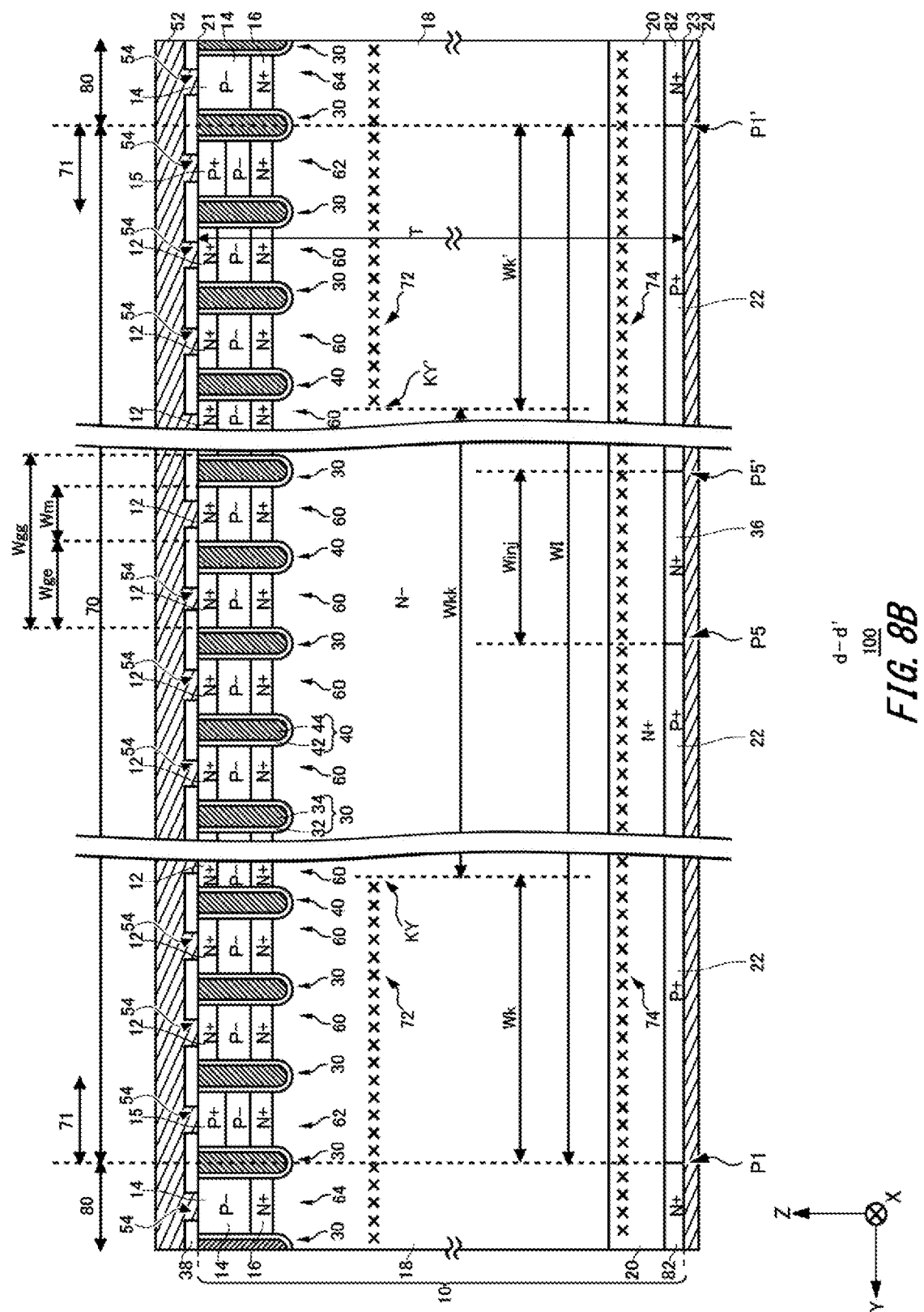
FIG. 8B shows an example of the cross section along the line d-d' in FIG. 8A.

FIG. 8B shows an example of the cross section along the line d-d' in FIG. 8A. As shown in FIG. 8B, the semiconductor device 100 of the present example is provided with the N⁺ type injection inhibition region 36 sandwiched between collector regions 22 in the Y-axis direction, in the bottom surface 23 of the transistor portion 70. The Y-axis direction positions of the end portion P5 and the end portion P5' may be respectively the same as the Y-axis direction positions of the end portion P2 and the end portion P2' in the semiconductor device 100 shown in FIG. 2B.

The semiconductor device 100 of the present example includes the injection inhibition region 36 having the first conductivity type and provided in the bottom surface 23 farther inward than the collector region 22 provided in the bottom surface 23, at respective Y-axis direction ends of the transistor portion 70. Furthermore, since the injection inhibition region 36 is N⁺ type, holes are not injected from the injection inhibition region 36. Therefore, the carrier concentration in the direction from the injection inhibition region 36 toward the top surface 21, particularly the hole concentration, is lower than the hole concentration of the collector region 22. Accordingly, in the same manner as in the semiconductor device 100 shown in FIG. 2B, even when the gate resistance Rg is small and the transistor portion 70 switches in a state where the channel caused by the electron inversion layer is closed, it is possible to restrict the accumulation of holes in the top surface 21 side of the first mesa portion 60. Therefore, it is possible to improve the withstand capability of the transistor portion 70, and to restrict damage of the transistor portion 70 that can occur when the carrier avalanche is high.

In the present example, the width Winj of the first low injection region 27 in the Y-axis direction may be greater than or equal to the width Wge and less than or equal to ⅓ of the width WI, in the same manner as in the semiconductor device 100 shown in FIG. 2B. Since the first low injection region 27 of the present example is N⁺ type, the transistor portion 70 including the first low injection region 27 operates more easily as a diode when the width Winj is larger. Therefore, the width Winj is preferably as small as possible, within the range of being greater than or equal to the width Wge and less than or equal to ⅓ of the width WI.

Figure 9A:
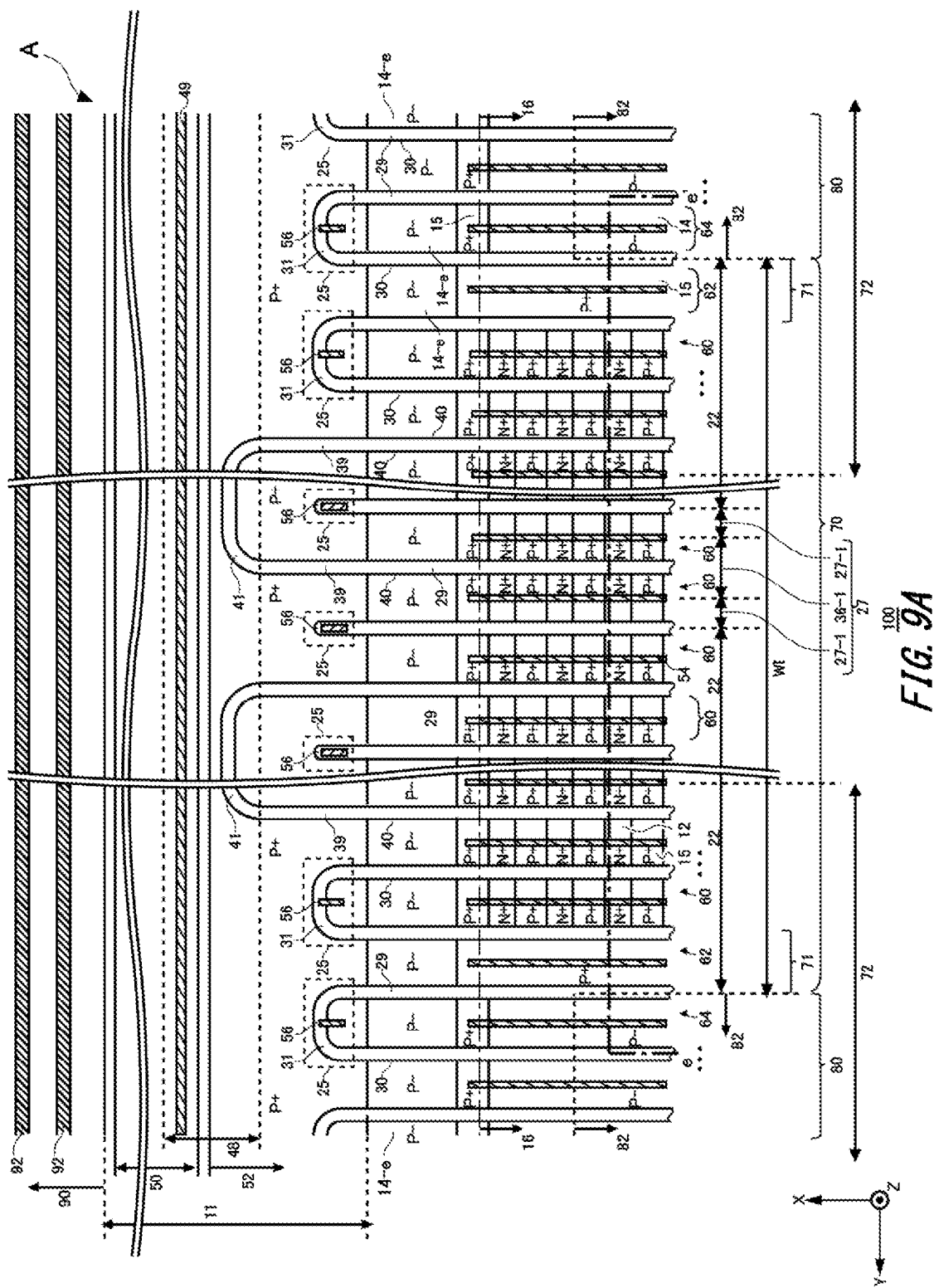
FIG. 9A an enlarged view of another example of the region A in FIG. 1.

FIG. 9A is an enlarged view of another example of the region A in FIG. 1. The semiconductor device 100 shown in FIG. 9A differs from the semiconductor device 100 shown in FIG. 2A in that the first low injection region 27 includes an injection inhibition region 36-1 having a conductivity type opposite the conductivity type of the collector region 22. The injection inhibition region 36-1 of the present example is N⁺ type, for example. First low injection regions 27-1 are provided respectively at the Y-axis directions ends of the injection inhibition region 36-1.

Figure 9B:
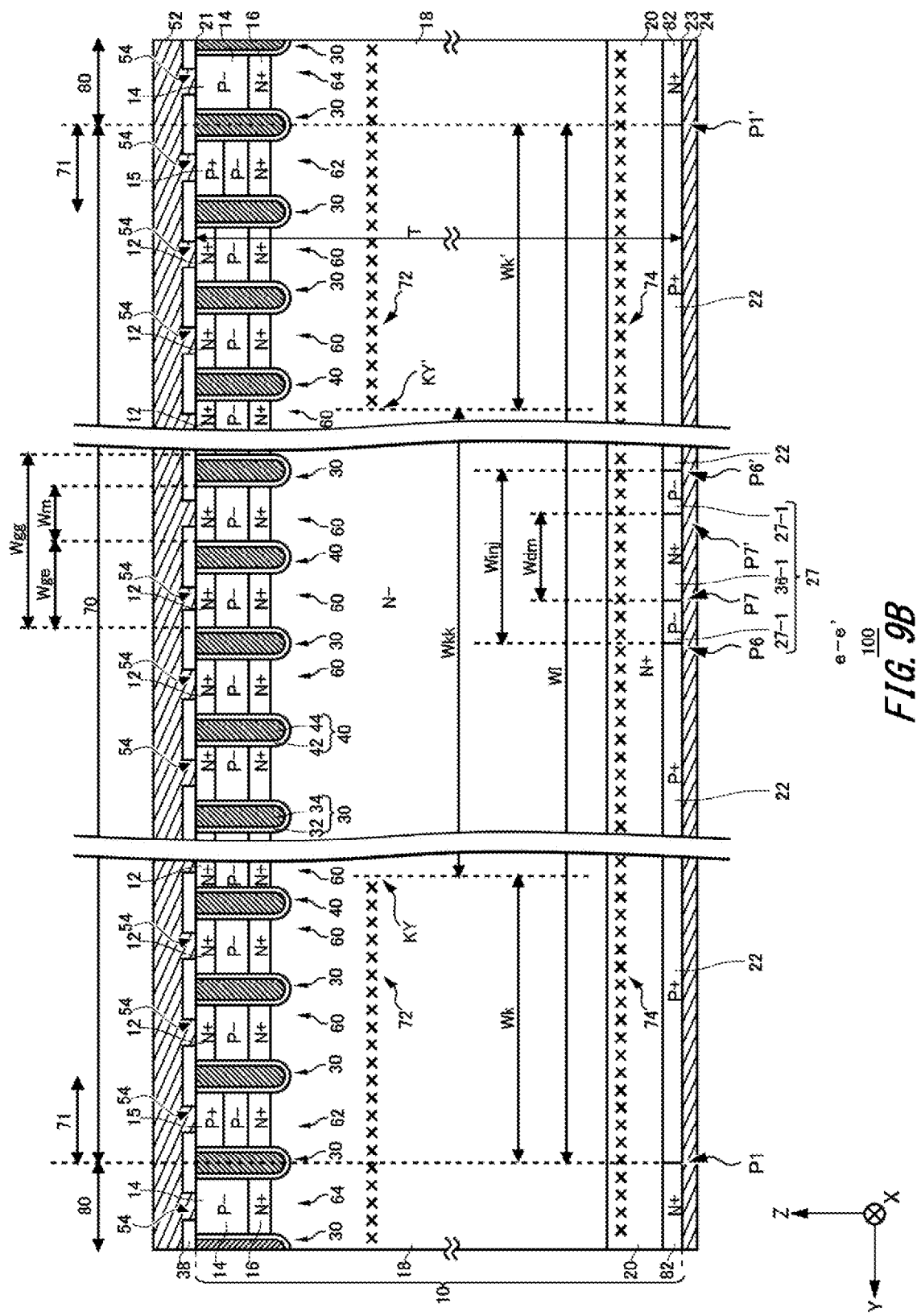
FIG. 9B shows an example of the cross section along the line e-e' in FIG. 9A.

FIG. 9B shows an example of the cross section along the line e-e' in FIG. 9A. As shown in FIG. 9B, the semiconductor device 100 of the present example is provided with the first low injection region 27 sandwiched between collector regions 22 in the Y-axis direction, in the bottom surface 23 of the transistor portion 70. The first low injection region 27 of the present example includes a first low injection region 27-1 having the second conductivity type and the injection inhibition region 36-1 having the first conductivity type. The injection inhibition region 36-1 may be sandwiched between two of the first low injection regions 27-1 in the Y-axis direction, but does not need to be.

The doping concentration of the injection inhibition region 36-1 may be equal to the doping concentration of the cathode region 82. The doping concentration of the injection inhibition region 36-1 may be equal to the doping concentration of the buffer region 20. The doping concentration of the injection inhibition region 36-1 may be N⁻ type and equal to the doping concentration of the drift region 18. The injection inhibition region 36-1 of the present example is N⁺ type, as an example.

The doping concentration of the first low injection region 27-1 is lower than the doping concentration of the collector region 22. The doping concentration of the first low injection region 27-1 may be equal to the doping concentration of the base region 14.

In the present example, the end portion P7 is the positive Y-axis direction side end portion of the injection inhibition region 36-1. Furthermore, the end portion P7 is the negative Y-axis direction side end portion of the first low injection region 27-1 provided on the positive Y-axis direction side of the injection inhibition region 36-1. In the present example, the end portion P7' is the negative Y-axis direction side end portion of the injection inhibition region 36-1. Furthermore, the end portion P7' is the positive Y-axis direction side end portion of the first low injection region 27-1 provided on the negative Y-axis direction side of the injection inhibition region 36-1. The Y-axis direction positions of the end portion P6 and the end portion P6' may be respectively the same as the Y-axis direction positions of the end portion P2 and the end portion P2' in the semiconductor device 100 shown in FIG. 2B.

In the present example, the width Wdm is the width in the Y-axis direction of the injection inhibition region 36-1, i.e.

the width in the Y-axis direction from the end portion P7 to the end portion P7'. The width Wdm is less than the width Winj.

The semiconductor device 100 of the present example includes the first low injection region 27 provided in the bottom surface 23 farther inward than the collector region 22 provided in the bottom surface 23, at the respective Y-axis direction ends of the transistor portion 70. Furthermore, the first low injection region 27 includes the first low injection region 27-1 having the second conductivity type and the injection inhibition region 36-1 having the first conductivity type. The hole injection density of the first low injection region 27-1 is lower than the hole injection density of the collector region 22, and holes are not injected from the injection inhibition region 36-1. Therefore, in the same manner as in the semiconductor device 100 shown in FIG. 2B, even when the gate resistance Rg is small and the transistor portion 70 switches in a state where the channel caused by the electron inversion layer is closed, it is possible to restrict the accumulation of holes on the top surface 21 side of the first mesa portion 60. Therefore, it is possible to improve the withstand capability of the transistor portion 70, and to restrict breakdown of the transistor portion 70 that can occur when the carrier avalanche is high.

Figure 10:
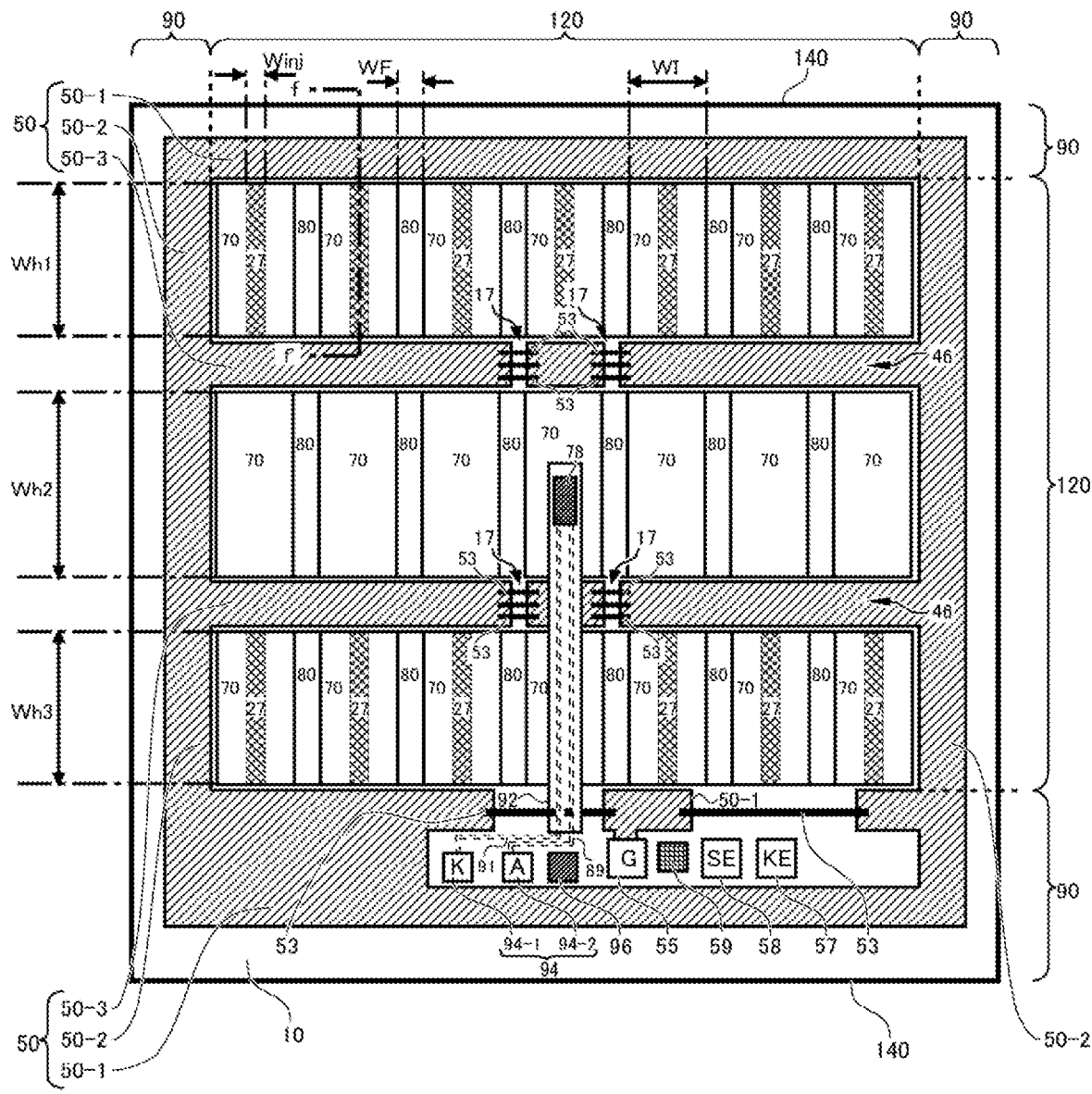
FIG. 10 shows an example of the arrangement of the first low injection region 27 of the semiconductor device 100 according to the present embodiment.

FIG. 10 shows an example of the arrangement of the first low injection region 27 of the semiconductor device 100 according to the present embodiment. In FIG. 10, the diagonal line portions of the transistor portions 70 and the diode portions 80, the cathode region 82, the emitter electrodes 52, and the emitter bridges 52-4 shown in FIG. 1 are omitted, in order to make the drawing more easily viewable.

In the present example, the transistor portions 70 at the respective ends in the extension direction (X-axis direction) each include the first low injection region 27 provided in the bottom surface 23 of the semiconductor substrate 10. In other words, a transistor portion 70 whose width in the X-axis direction is the width Wh1 and that is provided farthest on the positive or negative X-axis direction side includes a first low injection region 27 at the Y-axis direction center thereof. The first low injection region 27 is provided on the bottom surface 23 side of the semiconductor substrate 10. In FIG. 10, each region where a first low injection region 27 is provided in the top view of the semiconductor substrate 10 is shown by a net pattern.

This transistor portion 70 includes a collector region 22 on the bottom surface 23 side in the region where the transistor portion 70 contacts the first low injection region 27 in the Y-axis direction. Furthermore, among the transistor portions 70 on the negative X-axis direction side, the first low injection region 27 is provided below the temperature sensing wire 92 in the transistor portion 70 that is provided in the center in the Y-axis direction and overlaps with the temperature sensing wire 92 in the top view of FIG. 10.

In the present example, the transistor portions 70 that are not at the respective X-axis direction ends include the collector region 22 provided in the bottom surface 23 of the semiconductor substrate 10, and do not include the first low injection region 27. In other words, each transistor portion 70 whose width in the X-axis direction is the width Wh2 and is provided in the center in the X-axis direction does not include the first low injection region 27 in the center thereof in the Y-axis direction. Each of these transistor portions 70 includes the collector region 22 in the bottom surface 23 of the semiconductor substrate 10.

In the present example, one transistor portion 70 that is not at a respective X-axis direction end is provided in the X-axis direction, but there may be a plurality of transistor portions 70 that are not at a respective X-axis direction end. In such a case, these transistor portions 70 may each include the collector region 22 and not include the first low injection region 27 in the bottom surface 23 of the transistor portion 70.

In the present example, since the width Wh1 is less than the width Wh2, the distance from each of the gate metal layer 50-1 and the gate metal layer 50-3 adjacent in the X-axis direction to a transistor portion 70 having the width Wh1 to the center of this transistor portion 70 in the X-axis direction is less than the distance from each gate metal layer 50-3 adjacent in the X-axis direction to a transistor portion 70 having the width Wh2 to the center of this transistor portion 70 in the X-axis direction. Therefore, a transistor portion 70 having the width Wh1 has a lower resistance from the gate metal layer 50 to the center of this transistor portion 70 than a transistor portion 70 having a width Wh2. Accordingly, transistor portions 70 having the width Wh1 and transistor portions 70 having the width Wh2 are prone to operating unevenly. The Y-axis direction center of a transistor portion 70 having the width Wh1 is more prone to having a large voltage applied thereto than the Y-axis direction center of a transistor portion 70 having the width Wh2.

In the semiconductor device 100 of the present example, since the Y-axis direction center of a transistor portion 70 having the width Wh1 is more prone to having a large voltage applied thereto than the Y-axis direction center of a transistor portion 70 having the width Wh2, when the gate resistances Rg of the transistor portions 70 are low, it is easy for hole avalanches due to localized impact ionization to occur, and it is easy for the transistor portions 70 to break down when the carrier avalanche is high. Therefore, by providing the first low injection region 27 in the bottom surfaces 23 of the transistor portions 70 having the width Wh1 to restrict the hole avalanches due to localized impact ionization, it is possible to restrict breakdown of the transistor portions 70 even when the carrier avalanche is high.

Figure 11:
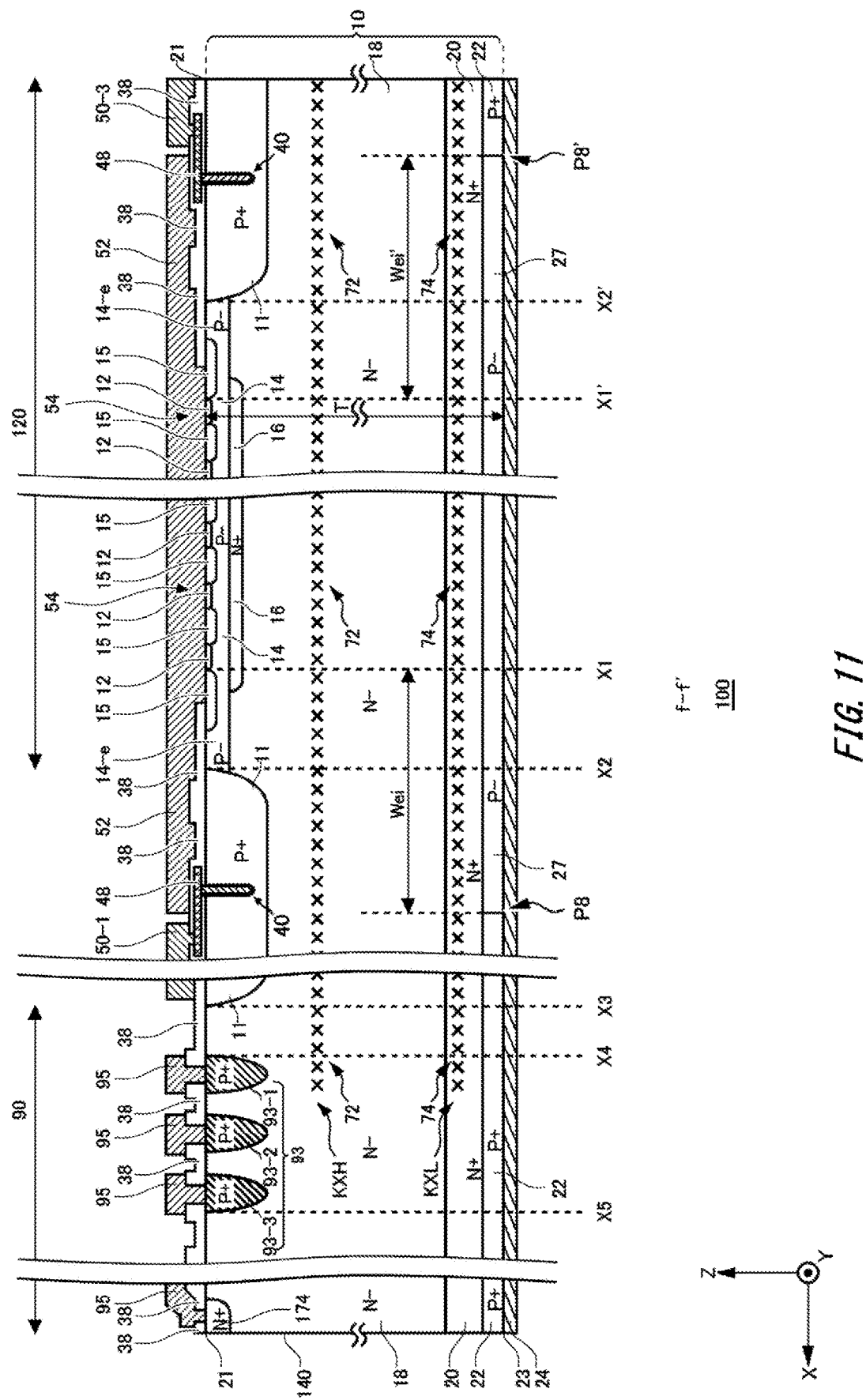
FIG. 11 shows an example of the cross section along the line f-f' in FIG. 10.

FIG. 11 shows an example of the cross section along the line f-f' in FIG. 10. In the transistor portion 70, the position of the f-f' cross section in the Y-axis direction corresponds to the position of the one-dot chain line portion ff' in the example shown in FIG. 2A. In other words, the f-f' cross sectional plane is the XZ plane passing through the first low injection region 27 on the bottom surface 23 side of the transistor portion 70. Furthermore, the f-f' cross-sectional plane is the XZ plane passing through the channel stopper 174, the guard ring 93, the well region 11, the gate trench portion 40, the base region 14-e, the contact region 15, and the emitter region 12 on the top surface 21 side. Yet further, the f-f' cross-sectional plane is the XZ plane passing through the contact hole 54 above the top surface 21.

The f-f cross section of the semiconductor device 100 of the present example includes the semiconductor substrate 10, the interlayer dielectric film 38, the gate runner 48, the emitter electrode 52, the gate metal layer 50-1, a field plate 95, and the collector electrode 24. The emitter electrode 52 and the field plate 95 are provided on the top surface 21 of the semiconductor substrate 10 and the top surface of the interlayer dielectric film 38.

The well region 11 is provided between the active region 120 and the peripheral region 90 in the X-axis direction. In the f-f cross section, the gate trench portion 40 is provided in the well region 11. The cross section of the gate trench portion 40 in the f-f' cross section is a cross section of the connecting portion 41 of the gate trench portion 40, in the top view of FIG. 2A. The gate conducting portion is connected to the gate runner 48. The well region 11 may be provided to a depth that is greater than the depth of the gate trench portion 40 in the Z-axis direction.

In the f-f' cross section, the well region 11 is also provided on the center side of the active region 120, i.e. the negative X-axis direction side of the active region 120. The base region 14-e, the emitter region 12, and the contact region 15 are provided in contact with the top surface 21 between the well region 11, which is provided between the active region 120 and the peripheral region 90, and the well region 11 provided on the center side of the active region 120, in the X-axis direction. The base region 14-e is provided in contact with the well region 11 in the X-axis direction. The emitter region 12 and the contact region 15 are provided in an alternating manner between the base regions 14-e provided at the respective X-axis direction ends. The contact region 15 may be provided to a depth from the top surface 21 in the X-axis direction that is greater than the depth of the emitter region 12.

The base region 14 is provided below the emitter region 12 and the contact region 15. The base region 14 may be connected to the base region 14-e exposed in the top surface 21 at the respective X-axis direction ends, inside the semiconductor substrate 10.

The accumulation region 16 may be provided below the base region 14. The accumulation region 16 may be provided continuously in the X-axis direction, from below the contact region 15 provided farthest on the positive X-axis direction side to the contact region 15 provided farthest on the negative X-axis direction side. The position of the bottom surface of the well region 11 in the Z-axis direction may be arranged below the position of the bottom surface of the accumulation region 16 in the Z-axis direction.

In the present example, the guard ring 93 having the second conductivity type and a channel stopper 174 having the first conductivity type are provided in the peripheral region 90. The guard ring 93 of the present example is P$^-$ type, for example. Furthermore, the channel stopper 174 of the present example is N$^+$ type, for example. The guard ring 93 relaxes electric field concentration on the top surface 21 side of the semiconductor substrate 10. A plurality of the guard rings 93 may be provided from the negative X-axis direction side toward the positive X-axis direction side. In the present example, three guard rings 93-1 to 93-3 are provided, as an example, but four or more guard rings 93 may be provided instead.

The buffer region 20 is provided continuously in the X-axis direction across the active region 120 from the peripheral edge 140, below the drift region 18. The collector region 22 and the first low injection region 27 are provided in contact with the bottom surface 23, below the buffer region 20.

In the present example, the end portion P8 is the end portion of the first low injection region 27 on the peripheral region 90 side in the X-axis direction. The end portion P8' is the end portion side of the first low injection region 27 on the active region 120 side in the X-axis direction. The first low injection region 27 is provided continuously in the X-axis direction, from the end portion P8 to the end portion P8'. The collector region 22 is provided from the end portion P8 to the peripheral edge 140. Furthermore, the collector region 22 is also provided from the end portion P8' to the active region 120.

In the present example, the position X1 is the position of the peripheral region 90 side end portion of the emitter region 12 that is provided farthest on the peripheral region 90 side among the emitter regions 12. The position X2 is the position of the active region 120 side end portion of the well region 11 provided between the active region 120 and the peripheral region 90. The position X3 is the position of the peripheral region 90 side end portion of this well region 11. The position X4 is the position of the active region 120 side end portion of the guard ring 93-1 provided farthest on the active region 120 side in the peripheral region 90. The position X5 is the position of the peripheral edge 140 side end portion of the guard ring 93-3 provided farthest on the peripheral edge 140 side in the peripheral region 90.

In the present example, the position X1' is the position of the active region 120 side end portion of the emitter region 12 provided farthest on the active region 120 side among the emitter regions 12. The position X2' is the position of the peripheral region 90 side end portion of the well region 11 provided in the active region 120.

The end portion P8 may be arranged at a predetermined distance from the position X1 on the peripheral region 90 side. This predetermined distance is the width Wei in FIG. 11. The width Wei may be less than the carrier (holes in the present example) diffusion length Lp. By making the width Wei less than the carrier diffusion length, the carrier injection density exhibits a non-zero value below the emitter region 12 provided farthest on the peripheral region 90 side. The width Wei may be greater than or equal to 100 µm and less than or equal to 300 µm. The width Wei is 200 µm, for example. The end portion P8 may be provided below the well region 11 that is provided between the active region 120 and the peripheral region 90 in the X-axis direction.

The end portion P8 may be arranged in the peripheral region 90. Specifically, the end portion P8 may be arranged between the position X3 and the position X4 in the X-axis direction, or may be arranged between the position X4 and the position X5 in the X-axis direction. The end portion P8 may be provided below the guard ring 93.

When the transistor portion 70 is operating, a channel is formed by the electron inversion layer in the base region 14 below the emitter region 12. This channel is formed in the front layer of the interface where the gate trench portion 40 contacts the emitter region 12 and the base region 14. By arranging the end portion P8 at a third distance from the position X1 on the peripheral region 90 side, the first low injection region 27 is arranged below this gate trench portion 40. Therefore, even when the gate resistance Rg is small and the transistor portion 70 switches in a state where the channel caused by the electron inversion layer is closed, it is possible to restrict the accumulation of holes on the top surface 21 side of the first mesa portion 60. Accordingly, it is possible to suppress the electric field concentration and restrict the occurrence of avalanche breakdown compared to on the top surface 21 side position of the collector region 22 in the Y-axis direction. Accordingly, it is possible to improve the withstand capability of the transistor portion 70, and to restrict breakdown of the transistor portion 70 that can occur when the carrier avalanche is high.

In order to more effectively restrict the accumulation of holes on the top surface 21 side of the first mesa portion 60, the width Wei is preferably larger. Specifically, the end portion P8 may be provided below the well region 11 that is provided between the active region 120 and the peripheral region 90, or may be provided below the guard ring 93.

The end portion P8' may be arranged at a third distance from the position X1' on the active region 120 side. This third distance is the width Wei' in FIG. 11. The width Wei' may be equal to the width Wei. The width Wei' may be greater than or equal to 100 µm and less than or equal to 300 µm, in the same manner as the width Wei. The width Wei' is 200 µm, for example. The end portion P8' may be provided below the well region 11 that is provided on the negative X-axis direction side of the active region 120, in the X-axis direction.

In the present example, the end portion KXH is the positive X-axis direction side end portion of the top surface side lifetime control region 72. The end portion KXL is the positive X-axis direction side end portion of the bottom surface side lifetime control region 74. The end portion KXH and the end portion KXL are arranged on the peripheral region 90 side of the position X4. The end portion KXH and the end portion KXL may be arranged at the same position in the X-axis direction, or may be arranged at different positions.

The top surface side lifetime control region 72 and the bottom surface side lifetime control region 74 may be provided continuously in the X-axis direction, to the transistor portion 70 having the width Wh2 provided in the X-axis direction center in FIG. 10. Furthermore, the top surface side lifetime control region 72 and the bottom surface side lifetime control region 74 may be provided continuously in the X-axis direction, to the transistor portion 70 having the width Wh1 provided farthest on the negative X-axis direction side in FIG. 10.

Figure 12:
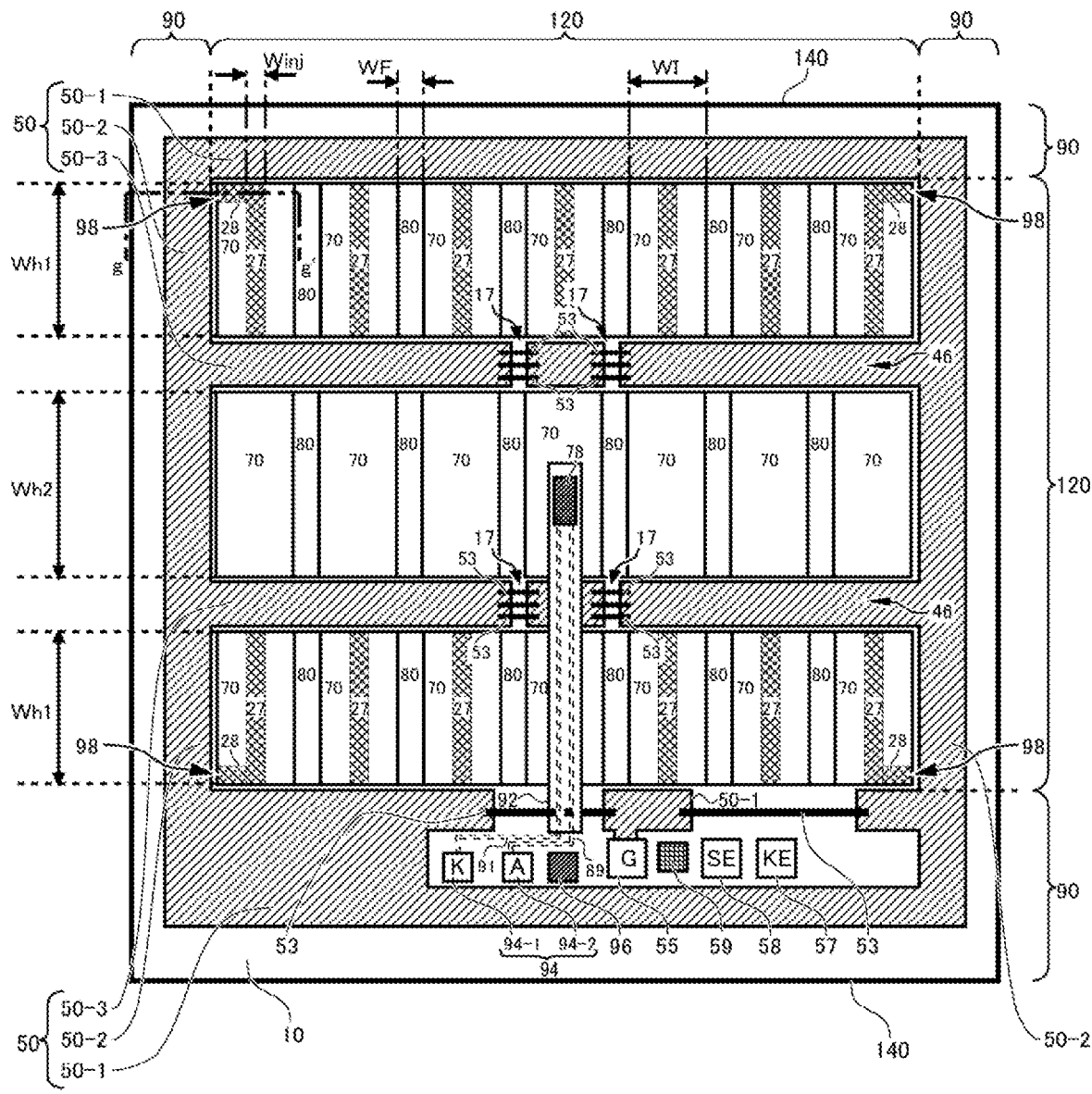
FIG. 12 shows another example of the top surface of the semiconductor device 100 according to the present embodiment.

FIG. 12 shows another example of the top surface of the semiconductor device 100 according to the present embodiment. In the semiconductor device 100 shown in FIG. 12, a corner portion 98 is formed in the transistor portion 70 provided farthest on the positive X-axis direction side and positive Y-axis direction side, in a region opposite the first gate metal layer 50-1 on the positive X-axis direction side in the extension direction and opposite the second gate metal layer 50-2 on the positive Y-axis direction side in the arrangement direction.

Furthermore, a corner portion 98 is formed in the transistor portion 70 provided farthest on the positive X-axis direction side and negative Y-axis direction side, in a region opposite the first gate metal layer 50-1 on the positive X-axis direction side in the extension direction and opposite the second gate metal layer 50-2 on the negative Y-axis direction side in the arrangement direction.

A corner portion 98 is formed in the transistor portion 70 provided farthest on the negative X-axis direction side and positive Y-axis direction side, in a region opposite the first gate metal layer 50-1 on the negative X-axis direction side in the extension direction and opposite the second gate metal layer 50-2 on the positive Y-axis direction side in the arrangement direction.

A corner portion 98 is formed in the transistor portion 70 provided farthest on the negative X-axis direction side and negative Y-axis direction side, in a region opposite the first gate metal layer 50-1 on the negative X-axis direction side in the extension direction and opposite the second gate metal layer 50-2 on the negative Y-axis direction side in the arrangement direction.

As shown in FIG. 12, the semiconductor device 100 of the present example differs from the semiconductor device 100 shown in FIG. 10 in that a second low injection region 28 is provided in each corner portion 98, on the bottom surface 23 side of the semiconductor substrate 10. The carrier (holes in the present example) injection density of the second low injection region 28 from the bottom surface 23 side to the top surface 21 side of the semiconductor substrate 10 is lower than that of the collector region 22.

Figure 13:
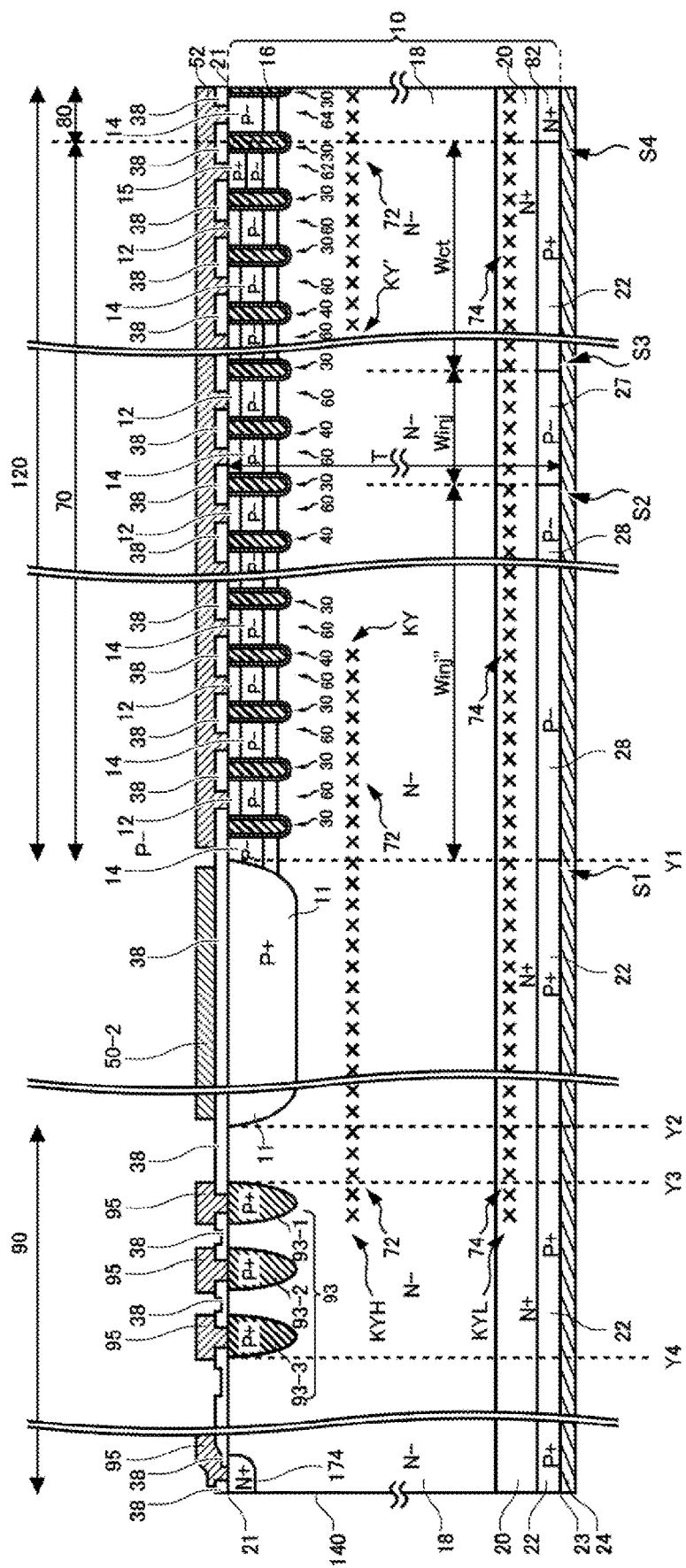
FIG. 13 shows an example of the cross section along the line g-g' in FIG. 12.
Figure 13:
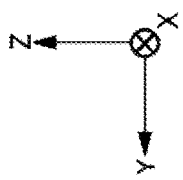

FIG. 13 shows an example of the cross section along the line g-g' in FIG. 12. The g-g' cross section is the YZ plane passing through the second low injection region 28 of the transistor portion 70. Furthermore, the g-g' cross section is the YZ plane passing through a channel stopper 174, the guard ring 93, the well region 11, the gate trench portion 40, the dummy trench portion 30, the base region 14, the contact region 15, and the emitter region 12, on the top surface 21 side.

In the g-g' cross section, the semiconductor device 100 of the present example includes the semiconductor substrate 10, the interlayer dielectric film 38, the emitter electrode 52, the gate metal layer 50-2, the field plate 95, and the collector electrode 24. The emitter electrode 52 and the field plate 95 are provided on the top surface 21 of the semiconductor substrate 10 and the top surface of the interlayer dielectric film 38.

The well region 11 is provided between the active region 120 and the peripheral region 90, in the Y-axis direction. The position Y1 is the position of the negative Y-axis direction side end portion of the well region 11. The position Y2 is the position of the positive Y-axis direction side end portion of the well region 11.

Furthermore, the position Y3 is the position of the active region 120 side end portion of the guard ring 93-1 provided farthest on the active region 120 side, in the peripheral region 90. The position Y4 is the position of the peripheral edge 140 side end portion of the guard ring 93-3 provided farthest on the peripheral edge 140 side in the peripheral region 90.

In the g-g' cross section, the semiconductor device 100 of the present example includes the collector region 22, the cathode region 82, the first low injection region 27, and the second low injection region 28 in contact with the bottom surface 23. The carrier injection density of the second low injection region 28 from the bottom surface 23 side to the top surface 21 side is lower than this carrier injection density of the collector region.

In the present example, the integrated concentration obtained by integrating the doping concentration of the second low injection region 28 in the Z-axis direction is lower than the integrated concentration obtained by integrating the doping concentration of the collector region 22 in the Z-axis direction. The doping concentrations of the second low injection region 28 and the collector region 22 may have distributions in the Z-axis direction, or may be uniform in the Z-axis direction.

In the present example, the second low injection region 28 is a region with a lower doping concentration than the collector region 22. The second low injection region 28 of the present example has the second conductivity type. The second low injection region 28 of the present example is P$^-$ type, for example. The doping concentration of the second low injection region 28 may be equal to that of the first low injection region 27, for both the peak concentration and the dose amount.

In the present example, the widths of the first low injection region 27 and the second low injection region 28 in the Z-axis direction may each be equal to the width of the collector region 22 in the Z-axis direction. Furthermore, the doping concentrations of the first low injection region 27 and the second low injection region 28 are each lower than the doping concentration of the collector region 22. Due to this, the carrier injection densities of the first low injection region 27 and the second low injection region 28 are each lower than the carrier injection density of the collector region 22. As another example, as shown in FIG. 6B, the widths of the first low injection region 27 and the second low injection region 28 in the Z-axis direction may each be greater than the width of the collector region 22 in the Z-axis direction. Furthermore, the doping concentrations of the first low injection region 27 and the second low injection region 28 may each be equal to the doping concentration of the collector region 22. Due to this, the carrier injection densities of the first low injection region 27 and the second low injection region 28 may each be lower than the carrier injection density of the collector region 22.

In the present example, the end portion S1 is the negative Y-axis direction side end portion of the collector region 22 and also the positive Y-axis direction side end portion of the second low injection region 28. The end portion S2 is the negative Y-axis direction side end portion of the second low injection region 28 and also the positive Y-axis direction side end portion of the first low injection region 27. The end portion S3 is the negative Y-axis direction side end portion of the first low injection region 27 and also the positive Y-axis direction side end portion of the collector region 22. The end portion S4 is the negative Y-axis direction side end portion of the collector region 22 and also the positive Y-axis direction side end portion of the cathode region 82.

The second low injection region 28 and the collector region 22 may contact each other at the end portion S1. This collector region 22 may be provided continuously in the Y-axis direction to the peripheral edge 140. Furthermore, this collector region 22 may contact the peripheral edge 140 at the positive Y-axis direction side.

In the present example, the second low injection region 28, but not the collector region 22, is provided in the region in the Y-axis direction from the end portion S1 to the end portion S2. The collector region 22 provided extending from the peripheral edge 140 to the active region 120 side terminates at the position of the end portion S1, without extending to the position of the end portion S2.

The first low injection region 27 and the second low injection region 28 may contact each other at the end portion S2. The first low injection region 27 and the collector region 22 may contact each other at the end portion S3. The collector region 22 and the cathode region 82 may contact each other at the end portion S4. The first low injection region 27 may be provided continuously in the Y-axis direction, from the end portion S2 to the end portion S3.

In the present example, the positions of the end portions S3 and the end portion S2 in the Y-axis direction, using the end portion S4 as a reference, may be the same as the positions of the end portions P2' and the end portion P2, using the end portion P1' as a reference, in the example shown in FIG. 2B.

In the present example, the width Winj" is the width in the Y-axis direction from the end portion S1 to the end portion S2, i.e. the width of the second low injection region 28 in the Y-axis direction. The width Wct is the width from the end portion S3 to the end portion S4, i.e. the width in the Y-axis direction of the collector region 22 sandwiched by the first low injection region 27 and the cathode region 82 in the Y-axis direction. The width Winj" may be equal to or different from the width Wct.

In the present example, the end portion KY of the top surface side lifetime control region 72 may be arranged on the positive Y-axis direction side of the end portion S2. The end portion KY' of the top surface side lifetime control region 72 may be arranged on the negative Y-axis direction side of the end portion S3.

In the present example, the end portion KYH is the positive Y-axis direction side end portion of the top surface side lifetime control region 72. The end portion KYL is the positive Y-axis direction side end portion of the bottom surface side lifetime control region 74. The end portion KYH and the end portion KYL may be arranged on the peripheral region 90 side of the position Y3. The end portion KYH and the end portion KYL may be arranged at the same position in the Y-axis direction or at different positions in the Y-axis direction.

In the g-g' cross section, the bottom surface side lifetime control region 74 may be arranged continuously in the Y-axis direction, from the end portion KYL to the diode portion 80. The bottom surface side lifetime control region 74 may be arranged continuously in the Y-axis direction, from the negative Y-axis direction side in FIG. 12 to the peripheral region 90.

In the present example, in a transistor portion 70, the region opposite both the first gate metal layer 50-1 and opposite the second gate metal layer 50-2 is the corner portion 98. In other words, the corner portion 98 is the region near the intersection point between the first gate metal layer 50-1 and the second gate metal layer 50-2. For the corner portion 98, both the distance from the corner portion 98 to the first gate metal layer 50-1 and the distance from the corner portion 98 to the second gate metal layer 50-2 are short. The gate voltage applied from the gate metal layer 50 at the corner portion 98 is prone to being greater than the gate voltage applied from the gate metal layer 50 at a region that is opposite the second gate metal layer 50-2 but not a corner portion 98. For example, a case can be thought of in which, in a transistor portion 70 of FIG. 12, the corner portion 98 is arranged farthest on the positive Y-axis direction side and farthest on the positive X-axis direction side. The region of the transistor portion 70 arranged on the negative X-axis direction side or the negative Y-axis direction side of this corner portion 98 has a wire for transmitting the gate voltage with a length that is greater than the length of this corner portion 98. Therefore, it is easier for the gate voltage applied to the corner portion 98 to become larger in this region than in other regions. Accordingly, at the corner portion 98, when the gate resistance Rg of the transistor portion 70 is low, it is easy for a hole avalanche caused by localized impact ionization to occur, and the transistor portion 70 is prone to breakdowns when the carrier avalanche is high. Therefore, by providing the second low injection region 28 in the bottom surface 23 of the corner portion 98 and restricting hole avalanches caused by localized impact ionization, it is possible to restrict the breakdown of the transistor portion 70 that can occur when the carrier avalanche is high.

Figure 14:
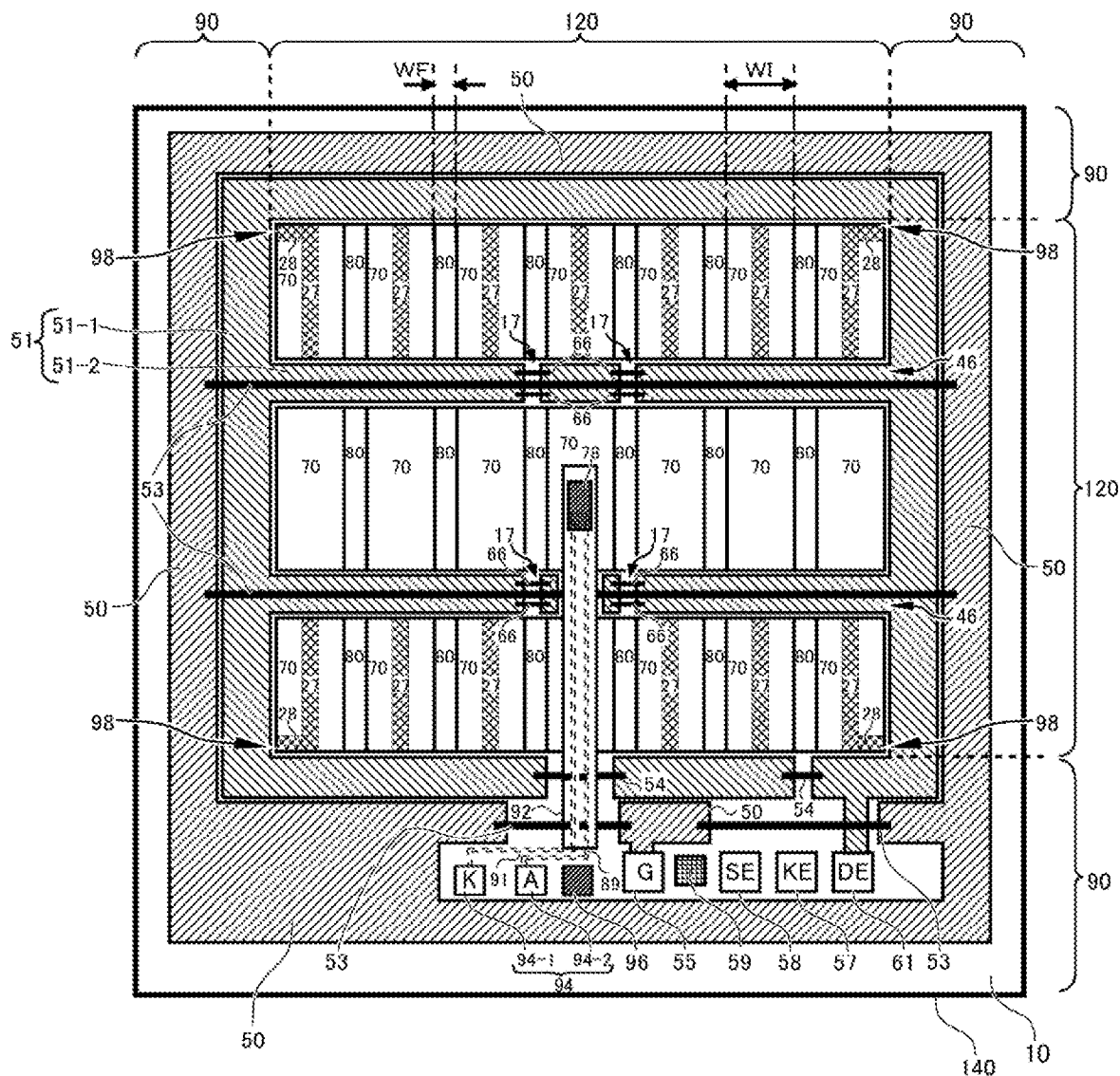
FIG. 14 shows an example of the top surface of a semiconductor device 200 according to the present embodiment.

FIG. 14 shows an example of the top surface of a semiconductor device 200 according to the present embodiment. The semiconductor device 200 of the present example differs from the semiconductor device 100 shown in FIG. 1 in that a dummy gate metal layer 51 is provided inside the gate metal layer 50, in the top view of the semiconductor substrate 10. Furthermore, the semiconductor device 200 of the present example differs from the semiconductor device 100 shown in FIG. 1 in that the gate metal layer 50-3 of the semiconductor device 100 shown in FIG. 1 is not provided above the active region 120. In FIG. 14, in order to make the drawing more easily viewable, the thick lines used to show the emitter electrodes 52 in FIG. 1 are omitted, in the same manner as in FIG. 10.

The dummy gate metal layer 51 may be provided surrounding the active region 120, on the inside of the gate metal layer 50, in the top view of the semiconductor substrate 10. In the present example, the portion of the dummy gate metal layer 51 arranged in the peripheral region 90 is a dummy gate metal layer 51-1, and the portion of the dummy gate metal layer 51 arranged above the active region 120 is a dummy gate metal layer 51-2. The dummy gate metal layer 51-2 is provided in the dividing section 46. In the present example, the dummy gate metal layer 51-2 is provided at both ends of the gap 17 in the Y-axis direction.

The dummy gate metal layer 51 may be formed of aluminum or an aluminum-silicon alloy. The dummy gate metal layer 51 is electrically connected to the diode portion 80, and supplies a dummy gate voltage to the dummy conducting portion 34 of the dummy trench portion 30 in the diode portion 80. The dummy gate metal layer 51 is connected to a dummy gate pad 61 provided in the peripheral region 90.

In the present example, the gate runner 53 is connected in the dividing section 46 to two gate metal layers 50 extending in the X-axis direction, in the top view of the semiconductor substrate 10. Furthermore, the gate runner 53 may be provided between the gate pad 55 and the active region 120 in the peripheral region 90 as well. The gate runner 53 provided in the peripheral region 90 may intersect with the temperature sensing wire 92, in the top view of the semiconductor substrate 10. This gate runner 53 is provided in the Y-axis direction through the region below the temperature sensing wire 92.

Both ends of this gate runner 53 are connected to the gate metal layer 50.

In the present example, a dummy gate runner 66 is connected to the dummy gate metal layer 51-2 arranged at respective Y-axis direction ends of the gap 17. The dummy gate runner 66 may be formed of a conductive material such as polysilicon to which impurities have been added. The dummy gate runner 66 may be provided between the active region 120 and the gate pad 55 that is outside the active region 120, in the X-axis direction, in the top view of the semiconductor substrate 10. The dummy gate runner 66 may be a trench type runner that is formed inside the semiconductor substrate 10.

The dummy gate metal layer 51 may supply the dummy gate voltage to the dummy trench portion 30 of the transistor portion 70 as well. By applying the dummy gate voltage to the dummy conducting portion 34 of the dummy trench portion 30, it is possible to perform a screening test for testing the insulation of the dummy insulating film 32.

Furthermore, a gate voltage signal may be applied to the dummy gate pad 61. Specifically, the dummy gate metal layer 51 may be used as a second gate metal layer that is not the gate metal layer 50.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

List of Reference Numerals

10 . . . semiconductor substrate; 11 . . . well region; 12 . . . emitter region; 14 . . . base region; 15 . . . contact region; 17 . . . gap; 18 . . . drift region; 20 . . . buffer region; 21 . . . top surface; 22 . . . collector region; 23 . . . bottom surface; 24 . . . collector electrode; 25 . . . connecting section; 26 . . . second injection region; 27 . . . first low injection region; 27-1 . . . first low injection region; 27-2 . . . dummy injection region; 28 . . . second low injection region; 29 . . . extending portion; 30 . . . dummy trench portion; 31 . . . connecting portion; 32 . . . dummy insulating film; 34 . . . dummy conducting portion; 36 . . . injection inhibition region; 36-1 . . . injection inhibition region; 38 . . . interlayer dielectric film; 39 . . . extending portion; 40 . . . gate trench portion; 41 . . . connecting portion; 42 . . . gate insulating film; 44 . . . gate conducting portion; 46 . . . dividing section; 48 . . . gate runner; 49 . . . contact hole; 50 . . . gate metal layer; 50-1 . . . gate metal layer; 50-2 . . . gate metal layer; 50-3 . . . gate metal layer; 51 . . . dummy gate metal layer; 51-1 . . . dummy gate metal layer; 51-2 . . . dummy gate metal layer; 52 . . . emitter electrode; 52-1 . . . emitter electrode; 52-2 . . . emitter electrode; 52-3 . . . emitter electrode; 52-4 . . . emitter bridge; 53 . . . gate runner; 54 . . . contact hole; 55 . . . gate pad; 56 . . . contact hole; 57 . . . Kelvin pad; 58 . . . current sensing pad; 59 . . . current sensing section; 60 . . . first mesa portion; 61 . . . dummy gate pad; 62 . . . second mesa portion; 64 . . . third mesa portion; 66 . . . dummy gate runner; 70 . . . transistor portion; 71 . . . boundary portion; 72 . . . top surface side lifetime control region; 74 . . . bottom surface side lifetime control region; 76 . . . lifetime control region; 78 . . . temperature sensing section; 80 . . . diode portion; 82 . . . cathode region; 89 . . . wire; 90 . . . peripheral region; 91 . . . wire; 92 . . . temperature sensing wire; 93 . . . guard ring; 93-1 . . . guard ring; 93-2 . . . guard ring; 93-3 . . . guard ring; 94 . . . temperature measurement pad; 95 . . . field plate; 96 . . . sensing section; 98 . . . corner portion; 99 . . . dummy gate metal layer; 100 . . . semiconductor device; 120 . . . active region; 140 . . . peripheral edge; 150 . . . semiconductor device; 200 . . . semiconductor device

What is claimed is:

1. A semiconductor device comprising:
   a semiconductor substrate;
   a transistor portion provided in the semiconductor substrate; and
   a diode portion provided in the semiconductor substrate and arranged adjacent to the transistor portion in a predetermined arrangement direction,
   wherein the transistor portion includes:
      a collector region provided in a bottom surface of the semiconductor substrate, at respective ends of the transistor portion that are adjacent to diode portions; and
      a first low injection region located within the transistor portion that is provided closer to the bottom surface than a top surface of the semiconductor substrate farther inward than the respective ends, and has a density of carrier injection between the bottom surface and the top surface of the semiconductor substrate that is lower than that of the collector region.

2. The semiconductor device according to claim 1, wherein
   the diode portion and the transistor portion are arranged in an alternating manner in the arrangement direction.

3. The semiconductor device according to claim 1, wherein
   the first low injection region includes a center of the transistor portion in the arrangement direction.

4. The semiconductor device according to claim 1, wherein
   the transistor portion includes a gate trench portion that is provided inside the semiconductor substrate from the top surface of the semiconductor substrate, and extends in an extension direction orthogonal to the arrangement direction in the top surface of the semiconductor substrate, and
   a portion of the first low injection region overlaps with the gate trench portion, in a top view of the semiconductor substrate.

5. The semiconductor device according to claim 4, further comprising:
   an active region in which the transistor portion and the diode portion are arranged, and through which a current flows between the top surface and the bottom surface of the semiconductor substrate; and
   a peripheral region provided between the active region and a peripheral edge of the semiconductor substrate, in a top view of the semiconductor substrate, wherein
   a plurality of emitter regions are provided in the extension direction in the transistor portion, in contact with the gate trench portion and the top surface of the semiconductor substrate,
   an end portion of the first low injection region on the peripheral region side in the extension direction is arranged at a predetermined distance in the extension direction from the emitter region provided closest to the peripheral region, in the top view of the semiconductor substrate, and
   the predetermined distance is less than a diffusion length of a carrier injected through the first low injection region.

6. The semiconductor device according to claim 5, wherein
   an end portion of the first low injection region on the peripheral region side in the extension direction is provided in the peripheral region, in the top view of the semiconductor substrate.

7. The semiconductor device according to claim 5, wherein
   the collector region extends in the extension direction from an end portion of the first low injection region on the peripheral region side in the extension direction to the peripheral region.

8. The semiconductor device according to claim 5, further comprising:
   a first gate metal layer that extends in the arrangement direction and is provided adjacent to the active region; and
   a second gate metal layer that extends in the extension direction orthogonal to the arrangement direction, is provided adjacent to the active region, and is connected to the first gate metal layer, wherein
   the active region includes a corner portion that is opposite the second gate metal layer in the arrangement direction and opposite the first gate metal layer in the extension direction that is orthogonal to the arrangement direction, in the top view of the semiconductor substrate, and
   the transistor portion further includes a second low injection region that is provided in the corner portion on the bottom surface side of the semiconductor substrate, and has a carrier injection density from the bottom surface side to the top surface side of the semiconductor substrate lower than that of the collector region.

9. The semiconductor device according to claim 1, wherein
   a width of the first low injection region in the arrangement direction is greater than or equal to a trench pitch in the arrangement direction and less than or equal to ⅓ of a width of the transistor portion in the arrangement direction.

10. The semiconductor device according to claim 1, wherein
    the first low injection region and the collector region have a second conductivity type, and
    an integrated concentration obtained by integrating a doping concentration of the first low injection region in a depth direction of the semiconductor substrate is lower than an integrated concentration obtained by integrating a doping concentration of the collector region in the depth direction of the semiconductor substrate.

11. The semiconductor device according to claim 10, wherein
    a thickness of the first low injection region is less than a thickness of the collector region, in the depth direction of the semiconductor substrate.

12. The semiconductor device according to claim 1, wherein
    the first low injection region includes a lifetime control region that contains a lifetime killer and is provided on the bottom surface side of the semiconductor substrate.

13. The semiconductor device according to claim 1, wherein
    at least a portion of the first low injection region includes an injection inhibition region having a conductivity type that is the opposite of a conductivity type of the collector region.

14. The semiconductor device according to claim 1, wherein
    a plurality of transistor portions, among which each transistor portion is the transistor portion, are arranged in an extension direction orthogonal to the arrangement direction,
    the transistor portions at respective ends in the extension direction each include the collector region and the first low injection region provided in the bottom surface of the semiconductor substrate, and
    each transistor portion that is not at a respective end includes the collector region provided in the bottom surface of the semiconductor substrate, but does not include the first low injection region in the bottom surface of the semiconductor substrate.

15. The semiconductor device according to claim 1, wherein the transistor portion includes a plurality of collector regions provided in the bottom surface of the semiconductor substrate, each collector region at an end in the predetermined arrangement direction of the transistor portion that is adjacent to the diode portion, wherein
    the first low injection region is located between collector regions.

16. A semiconductor device comprising:
    a semiconductor substrate;
    a transistor portion provided in the semiconductor substrate; and a diode portion provided in the semiconductor substrate and arranged adjacent to the transistor portion in a predetermined arrangement direction, wherein the transistor portion includes:

a collector region provided in a bottom surface of the semiconductor substrate, at respective ends of the transistor portion that are adjacent to diode portions; and a first low injection region that is provided closer to the bottom surface than a top surface of the semiconductor substrate farther inward than the respective ends, and has a density of carrier injection between the bottom surface and the top surface of the semiconductor substrate that is lower than that of the collector region; and a top surface side lifetime control region that is provided across the diode portion and part of the transistor portion in the arrangement direction, is provided on the top surface side of the semiconductor substrate, and includes a lifetime killer, wherein the first low injection region does not overlap with the top surface side lifetime control region, in a top view of the semiconductor substrate.

17. A semiconductor device comprising:

a semiconductor substrate;

a transistor portion provided in the semiconductor substrate; and a diode portion provided in the semiconductor substrate and arranged adjacent to the transistor portion in a predetermined arrangement direction, wherein the transistor portion includes:

a collector region provided in a bottom surface of the semiconductor substrate, at respective ends of the transistor portion that are adjacent to diode portions; and a first low injection region that is provided closer to the bottom surface than a top surface of the semiconductor substrate farther inward than the respective ends, and has a density of carrier injection between the bottom surface and the top surface of the semiconductor substrate that is lower than that of the collector region; wherein the first low injection region and the collector region have a second conductivity type, an integrated concentration obtained by integrating a doping concentration of the first low injection region in a depth direction of the semiconductor substrate is lower than an integrated concentration obtained by integrating a doping concentration of the collector region in the depth direction of the semiconductor substrate, and the doping concentration of the first low injection region is lower than the doping concentration of the collector region.

18. A semiconductor device comprising:

a semiconductor substrate;

a transistor portion provided in the semiconductor substrate; and a diode portion provided in the semiconductor substrate and arranged adjacent to the transistor portion in a predetermined arrangement direction, wherein the transistor portion includes:

a collector region provided in a bottom surface of the semiconductor substrate, at respective ends of the transistor portion that are adjacent to diode portions; and a first low injection region located within the transistor portion that is provided closer to the bottom surface than a top surface of the semiconductor substrate farther inward than the respective ends, and has a doping concentration that is lower than that of the collector region.

* * * * *